United States Patent [19]

Tsujioka et al.

[11] Patent Number: 5,398,223
[45] Date of Patent: Mar. 14, 1995

[54] REPRODUCING METHOD AND REPRODUCING APPARATUS FOR OPTICAL RECORDING MEDIUM

[75] Inventors: Tsuyoshi Tsujioka, Osaka; Masahiro Irie, 1-29-4-404, Kasugakouen, Kasuga-City, Fukuoka, both of Japan

[73] Assignees: Sanyo Electric Co., Ltd., Osaka; Masahiro Irie, Fukuoka, both of Japan

[21] Appl. No.: 96,437

[22] Filed: Jul. 26, 1993

[30] Foreign Application Priority Data

Jul. 27, 1992 [JP] Japan .................................. 4-199990
Apr. 15, 1993 [JP] Japan .................................. 5-088854

[51] Int. Cl.$^6$ ............................................. G11B 17/22
[52] U.S. Cl. .......................................... 369/32; 369/47
[58] Field of Search ....................... 369/32, 33, 47, 48, 369/100, 109, 110, 116, 275.2, 275.4, 275.5, 44.14, 44.26, 44.38, 54, 13, 121; 250/201.5; 428/694 R, 694 SC, 694 LE; 360/59, 114; 340/310 A; 372/29, 31, 38

[56] References Cited

U.S. PATENT DOCUMENTS 3,900,842  8/1975  Calabro et al. .................. 340/310 A
5,329,512  7/1994  Fukimoto et al. ................... 369/121

*Primary Examiner*—Ali Neyzari
*Attorney, Agent, or Firm*—Nikaido, Marmelstein, Murray & Oram

[57] ABSTRACT

A technique for improving a number of reproducible times in reproduction of information from an optical recording medium having a recording layer which reacts in a photon mode. The power of a reproducing beam is set in proximity to $P_{rep}$ (W) appearing in the following expression (I) or within a range of $P_{rep}$ (W) appearing in the following expression (II):

$$P_{rep} = \frac{SNR \cdot 2eB}{\eta\gamma} \cdot \frac{R_{ave}}{(\Delta R)^2} \quad (I)$$

$$\frac{SNR \cdot 2eB}{\eta\gamma} . \quad (II)$$

$$\frac{R_{ave}}{(\Delta R)^2} \leq P_{rep} \leq \frac{kT}{2eBR_{ave}\eta\gamma Z} \left( \text{or } \frac{I^2_{amp}}{2eBR_{ave}\eta\gamma} \right)$$

In order to improve an S-N ratio, squeezed light having suppressed photon number fluctuation is employed as a reproducing beam at need. If improvement of the number of reproducible times is in preference to improvement of the S-N ratio, such squeezed light having suppressed photon number fluctuation is employed as a reproducing beam with power which is set within a range of $P_{rep}$ (W) appearing in the following expression (III):

$$P_{rep} \leq \frac{SNR \cdot 2eB}{\eta\gamma} \cdot \frac{R_{ave}}{(\Delta R)^2} . \quad (III)$$

22 Claims, 30 Drawing Sheets

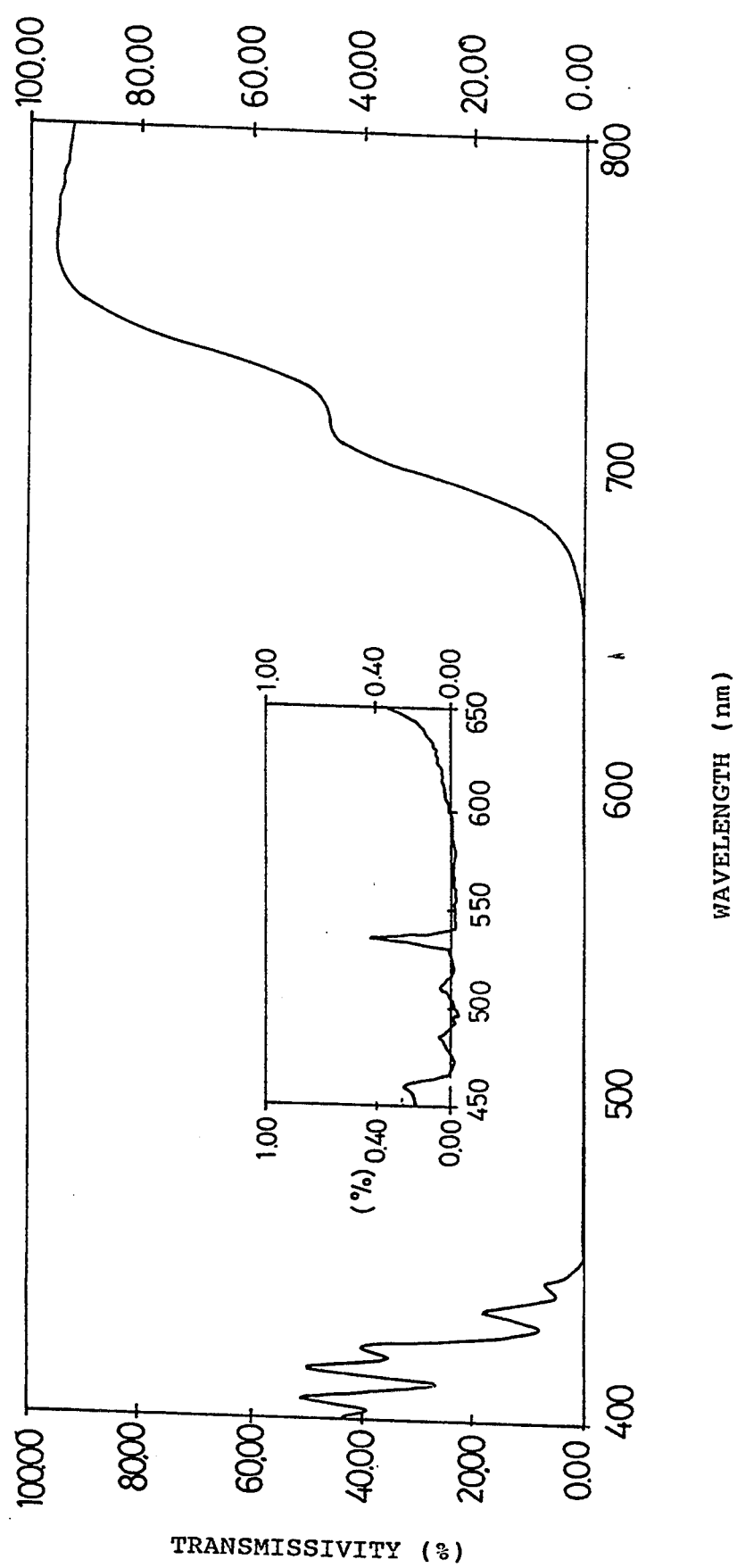

$R_L = 0.7$
$R_H = 0.9$ $R_L = 0.5$
$R_H = 0.9$ $R_L = 0.35$
$R_H = 0.6$ $R_L = 0.3$
$R_H = 0.5$

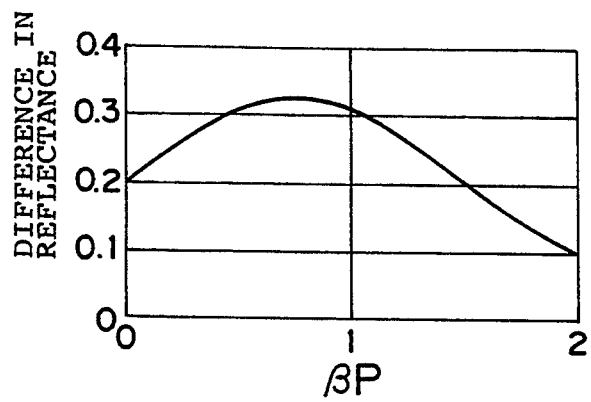
Fig.17A  $R_L = 0.1$  $R_H = 0.3$
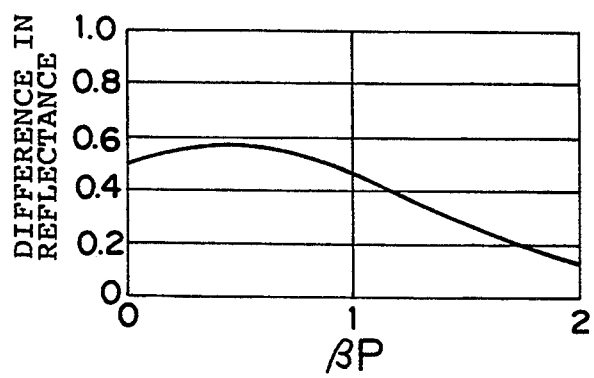
Fig.17B  $R_L = 0.1$  $R_H = 0.6$
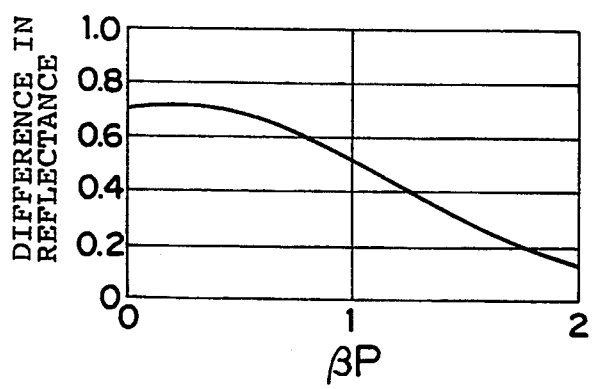
Fig.17C  $R_L = 0.1$  $R_H = 0.8$ NUMBER OF REPRODUCING TIMES (n)

NUMBER OF REPRODUCING TIMES (n)

NUMBER OF REPRODUCING TIMES (n)

REPRODUCING METHOD AND REPRODUCING APPARATUS FOR OPTICAL RECORDING MEDIUM

BACKGROUND OF THE INVENTION

1. Field of the Invention

The present invention relates to a reproducing method and a reproducing apparatus for an optical recording medium having a recording layer of a photochromic material etc. which reacts in a photon mode.

2. Description of the Background Art

In recent years, deep study is made on application of a photochromic material to a reloadable optical recording medium. When such a photochromic material is irradiated with light of a prescribed wavelength, its molecular structure is changed by photochemical reaction. Further, optical characteristics such as absorbance and a refractive index are additionally changed with respect to light of a constant wavelength, while the changed molecular structure can return to the original state when the photochromic material is irradiated with light of another wavelength or heated. Due to such properties, the photochromic material can be applied to an optical recording medium. In such an optical recording medium, it is possible to record information by irradiating the medium with light of a specific wavelength thereby changing its molecular structure, while the recorded information can be reproduced by detecting resulting changes of its optical characteristics, particularly absorbance. In relation to such an optical recording medium of a photon mode, it is well known that its reproducing power is disadvantageously reduced when the recorded information is repeatedly reproduced. Since photochromic molecules react in a photon mode, such reaction of the molecules slightly progresses even if the information is reproduced at a relatively low power level, to reduce the reproducing power following repetitive reproduction. As to a possible solution for such a problem, two methods are now under study.

The first method is adapted to reproduce information by detecting changes of optical characteristics other than absorbance, i.e., optical rotatory power, refractive index, birefringence etc., following photochromic reaction, with light of a wavelength allowing no absorption by the photochromic material. The second method is directed to development of the so-called gate type photochromic material which reacts only when a magnetic field, an electric field, heat or the like is applied thereto in addition to light.

However, it is difficult to apply the first method to multiplex recording which is prevailing means for high densification, for example. As to the second method, on the other hand, no success has yet been attained in synthesis of a gate type photochromic material which is responsive to a magnetic or electric field. Further, a heat gate type photochromic material loses high resolution, which characterizes the photon mode, by thermal diffusion.

SUMMARY OF THE INVENTION

An object of the present invention is to provide absolutely novel reproducing method and apparatus for an optical recording medium, not belonging to the aforementioned two conventional methods, which can remarkably improve the number of reproducible times even if information is reproduced with light in a wavelength band allowing absorption by a photochromic material.

A reproducing method according to a first aspect of the present invention, which is adapted to reproduce information from an optical recording medium provided with a recording layer reacting in a photon mode, comprises a step of irradiating the recording layer with a reproducing beam, and a step of detecting the reproducing beam passing through the recording layer for reproducing recorded and unrecorded states. The feature of this method resides in that the recording layer is irradiated with a reproducing beam whose power is set in proximity to $P_{rep}(W)$ in the following expression:

$$P_{rep} = \frac{SNR \cdot 2eB}{\eta \gamma} \cdot \frac{R_{ave}}{(\Delta R)^2} \qquad (I)$$

where SNR represents an S-N power ratio (PP/rms) required for the system, e represents an elementary electric charge of $1.6 \times 10^{-19}$ (C), B represents a bandwidth (Hz) of the system, $\eta$ represents sensitivity (A/W) of a photodetector to a gain 1, $\gamma$ represents pickup efficiency, $R_{ave}$ represents an average reflectance of the optical recording medium, and $\Delta R$ represents a difference in reflectance between recorded and unrecorded portions of the optical recording medium.

The term "proximity" indicates a one-digit range of 0.5 to 5 times, since the reproducing power level is related to a logarithmic change in the present invention.

A reproducing method according to a second aspect of the present invention, which is adapted to reproduce information from an optical recording medium provided with a recording layer reacting in a photon mode, comprises a step of irradiating the recording layer with a reproducing beam, and a step of detecting the reproducing beam passing through the recording layer for reproducing recorded and unrecorded states. The feature of this method resides in that power of the reproducing beam is set within a range of $P_{rep}(W)$ in the following expression (II):

$$\frac{SNR \cdot 2eB}{\eta \gamma} \cdot \frac{R_{ave}}{(\Delta R)^2} \leq P_{rep} \leq \frac{kT}{2eBR_{ave}\eta\gamma Z} \left( \text{or } \frac{I_{amp}^2}{2eBR_{ave}\eta\gamma} \right) \qquad (II)$$

where SNR represents an S-N power ratio (PP/rms) required for the system, e represents an elementary electric charge of $1.6 \times 10^{-19}$ (C), B represents a bandwidth (Hz) of the system, $\eta$ represents sensitivity (A/W) of a photodetector to a gain 1, $\gamma$ represents pickup efficiency (efficiency of reflected light from the medium for reaching the photodetector), $R_{ave}$ represents an average reflectance of the optical recording medium, $\Delta R$ represents a difference in reflectance between recorded and unrecorded portions of the optical recording medium, k represents the Boltzman constant of $1.38 \times 10^{-23}$ (J·K$^{-1}$), T represents an absolute temperature (K), $I_{amp}$ represents an average noise current (A) of a reproducing preamplifier, and Z represents impedance ($\Omega$) of the reproducing preamplifier.

In each of the reproducing methods according to the first and second aspects of the present invention, it is possible to detect the reproducing beam passing through the recording layer by a detector having a self amplifying function for a photocurrent.

A reproducing apparatus according to a third aspect of the present invention, which is adapted to reproduce information from an optical recording medium provided with a recording layer reacting in a photon mode, comprises a light source for emitting a reproducing beam with constant power, power control means for damping the reproducing beam from the light source to a power level of $P_{rep}$ appearing in the above expression (I) or (II) for irradiating the recording layer with the reproducing beam, a lens system for converging the reproducing beam on the recording layer, and a detector for detecting the reproducing beam passing through the recording layer and being reflected by the optical recording medium.

In the apparatus according to the third aspect of the present invention, the detector is preferably formed by a detector having a self amplifying function for a photocurrent.

A reproducing method according to a fourth aspect of the present invention, which is adapted to reproduce information from an optical recording medium provided with a recording layer reacting in a photon mode, comprises a step of irradiating the recording layer with a reproducing beam at a power level being set within the range of $P_{rep}$ appearing in the above expression (II), a step of detecting the reproducing beam passing through the recording layer for reproducing recorded and unrecorded states, and a step of irradiating the recording layer with light of a wavelength band allowing substantially no absorption by a photon mode material contained in the recording layer as a servo beam thereby carrying out at least either focus servo control or tracking servo control.

A reproducing apparatus according to a fifth aspect of the present invention, which is adapted to form an optical recording medium provided with a recording layer reacting in a photon mode, comprises a first light source for emitting a reproducing beam with constant power, power control means for damping the reproducing beam from the first light source to a power level within the range of $P_{rep}$ appearing in the above expression (II) and irradiating the recording layer with the reproducing beam, a second light source for emitting light of a wavelength band allowing substantially no absorption by a photon mode material contained in the recording layer as a servo beam, beam synthetic means for synthesizing the reproducing beam and the servo beam and guiding the synthesized beam to the same optical path, a lens system for converging the synthesized beam on the recording layer, a photodetector having a self amplifying function for a photocurrent for detecting a component of the reproducing beam contained in the synthesized beam passing through the recording layer and being reflected from the optical recording medium, and a servo optical system and a servo circuit system for detecting a component of the servo beam contained in the synthesized beam passing through the recording layer and being reflected from the optical recording medium for carrying out at least either focus servo control or tracking servo control.

In the apparatus according to the fifth aspect of the present invention, wavelength selection means which substantially transmits the reproducing beam and does not substantially transmit the servo beam can be provided in an optical path of the reproducing beam component, contained in the synthesized beam reflected from the optical recording medium, for entering the photodetector.

The beam synthetic means in the apparatus according to the fifth aspect of the present invention can be formed by a dichroic mirror, for example. When the beam synthetic means is thus formed by a dichroic mirror, it is possible to form the overall apparatus so that this dichroic mirror reflects the servo beam contained in the synthesized beam which is reflected from the optical recording medium.

In the apparatus according to the fifth aspect of the present invention, further, another wavelength selection means which substantially transmits the servo beam and does not substantially transmit the other beam emitted from the second light source can be provided between the second light source and the beam synthetic means.

A reproducing method according to a sixth aspect of the present invention is adapted to optically record information in an optical recording medium whose recording layer has a reflectance of not more than 0.4 for a reproducing beam in an unrecorded state, and to reproduce the same. According to this method, a recorded portion of the recording layer preferably has a reflectance of not more than 0.7 for the reproducing beam. When the recording layer has a reflectance of not more than 0.2 for the reproducing beam in an unrecorded state, further, the recorded portion preferably has a reflectance of at least 0.4 for the reproducing beam.

A reproducing method according to a seventh aspect of the present invention is characterized in that a reproducing beam is prepared from squeezed light which has suppressed photon number fluctuation.

A reproducing method according to an eighth aspect of the present invention is characterized in that a reproducing beam is prepared from squeezed light which has suppressed photon number fluctuation, and applied to an optical recording medium at a power level which is set within a range of $P_{rep}$ (W) in the following expression (III) for reproducing information:

$$P_{rep} \leq \frac{SNR \cdot 2eB}{\eta \gamma} \cdot \frac{R_{avr}}{(\Delta R)^2} \tag{III}$$

where SNR represents an S-N power ratio (PP/rms) required for the system, e represents an elementary electric charge of $1.6 \times 10^{-19}$ (C), B represents a bandwidth (Hz) of the system, $\eta$ represents sensitivity (A/W) of a photodetector to a gain 1, $\gamma$ represents pickup efficiency, $R_{ave}$ represents an average reflectance of the optical recording medium, and $\Delta R$ represents a difference in reflectance between recorded and unrecorded portions of the optical recording medium.

A light source for emitting the squeezed light which has suppressed photon number fluctuation can be formed by a semiconductor laser which is suppressed in spontaneous emission by a fine resonator structure and receives injection of an excitation current through a resistance of at least twice a differential resistance value.

According to the first aspect of the present invention, the power level of the reproducing beam is extremely reduced to increase the number of reproducing times. In general, such power reduction of the reproducing beam leads to an inferior S-N ratio. According to the present invention, the power of the reproducing beam is reduced to the minimum degree capable of ensuring a required S-N ratio in principle. Description is now made on this.

Noises appearing in an optical disk system include a disk noise which is caused by surface roughness of the disk, a laser noise which is caused by fluctuation of a laser beam, a thermal noise which is caused in a resistance part of a preamplifier system, and a shot noise which is caused by quantum-theoretical fluctuation of photons in the laser beam. The problems of the disk noise and the laser noise have already been technically solved and these noises have been suppressed to sufficiently low levels. On the other hand, the thermal noise and the shot noise, which are theoretical noises, cause problems in reduction of the power of the reproducing beam.

FIG. 1 shows relations between these noises and a signal level. Referring to FIG. 1, the axis of abscissas shows power of a reproducing beam, and the axis of ordinates shows outputs in units of dB. When the power of the reproducing beam is 1 mW, a signal is outputted at a reference level of 0 dB.

As clearly understood from FIG. 1, disk and laser noises are higher than heat and shot noises at a reproducing power level (up to 1 mW) employed for an ordinary optical disk, and a sufficient S-N ratio can be obtained since the signal level is sufficiently higher. When the reproducing power is reduced, the signal level and the disk and laser noises are lowered at 20 dB/dec., i.e., reduced by 20 dB when the reproducing power is 1/10. However, the thermal noise remains constant with no dependence on the reproducing power, as clearly understood from FIG. 1. On the other hand, the shot noise is reduced at 10 dB/dec. Consequently, factors for restricting the noises change targets from the disk and laser noises to the thermal noise and the shot noise in the vicinity of a point where the reproducing power is $10^{-5}$ to $10^{-6}$. In particular, the thermal noise is so constant that the S-N ratio is remarkably reduced by the thermal noise at a reproducing power level of the order of several $\mu$W. However, this reduction is caused since a thermal noise current generated in a preamplifier resistance part reaches an unignorable level as compared with a photocurrent. It is possible to increase the photocurrent to prevent reduction of the S-N ratio caused by the thermal noise, by employing a photodetector having a self amplifying function.

Even if the thermal noise can be thus suppressed, the shot noise serves as a factor for restricting the S-N ratio at a very low power level of the order of several 10 nW. This shot noise is substantially caused by quantum-theoretical fluctuation, as hereinabove described. According to the present invention, the power of the reproducing beam is so set that the ratio of the signal level to the level of the shot noise is identical to an S-N ratio which is required for the system.

Assuming that $P_{rep}$ represents reproducing power (W), $\eta$ represents photodetector sensitivity (A/W) corresponding to a gain 1, $\gamma$ represents pickup efficiency, $R_{ave}$ represents an average reflectance of the optical recording medium, $\Delta R$ represents a difference in reflectance between recorded and unrecorded portions of the optical recording medium, B represents a bandwidth (Hz) of the system and e represents an elementary electric charge of $1.6 \times 10^{-19}$ (C), a shot noise average current $I_{NS}$ (A) is expressed as follows:

$$I_{NS} = \sqrt{2eB \cdot \eta\gamma P_{rep} R_{ave}}$$

Further, a peak signal output current $I_S$ (A) is expressed as $I_S = \eta\gamma P_{rep}\Delta R$.

Hence, an S-N power ratio (PP/rms) is expressed as follows:

$$S/N = \frac{\eta\gamma P_{rep}}{2eB \cdot R_{ave}} \cdot (\Delta R)^2$$

Setting S/N appearing in the above expression as an S-N ratio which is required for the system, i.e., SNR, a solution as to $P_{rep}$ is expressed as follows:

$$P_{rep} = \frac{SNR \cdot 2eB}{\eta\gamma} \cdot \frac{R_{ave}}{(\Delta R)^2}$$

This value $P_{rep}$ represents the minimum possible power of the reproducing beam which can obtain the S-N ratio required for the system.

According to the first aspect of the present invention, therefore, it is possible to remarkably improve the number of reproducible times of the optical recording medium in a photon mode by reducing the power of the reproducing beam to a level in proximity to a prescribed value.

While the method according to the first aspect of the present invention is adapted to remarkably improve the number of reproducible times by reducing the reproducing power, the S-N ratio is lowered by a thermal noise. Such reduction of the S-N ratio can be prevented by employing a photodetector having a self amplifying function, such as an avalanche photodiode or a detector of a coherent photodetection system known as a homodyne/heterodyne system, for example, as hereinabove described.

In the method according to the second aspect of the present invention, such a photodetector having a self amplifying function is adapted to reduce the power of the reproducing beam within a range capable of preventing reduction of the S-N ratio. Description is now made on this.

Assuming that an amplifier noise average current level of a preamplifier part is expressed as $I_{amp} = i_{amp} \cdot B$, where $i_{amp}$ represents noise density and B represents a bandwidth, a region where $I_S \leq I_{amp}$ is set with respect to a shot noise current $I_S = (2eBI_a)^{\frac{1}{2}}$ as follows:

$$P_{rep} \leq \frac{i_{amp}^2}{2eBR_{ave}\gamma\eta}$$

where $I_a$ represents an average photocurrent of the photodetector with respect to a gain 1, which is expressed as $I_a = P_{rep} \cdot R_{ave}\gamma\eta$. Particularly when the amplifier noise level is governed by a thermal noise, thermal noise power $N_T = kTB$ is employed in place of $I_{amp}$, to set the range as follows:

$$P_{rep} \leq \frac{kT}{2eR_{ave}\gamma\eta Z}$$

where $P_{rep}$ represents the reproducing power (W), e represents an elementary electric charge of $1.6 \times 10^{-19}$ (C), $\gamma$ represents pickup efficiency, $\eta$ represents photodetector sensitivity (A/W) with respect to a gain 1, k represents the Boltzman constant of $1.38 \times 10^{-23}$ J·K$^{-1}$, T represents an absolute temperature (K), and Z represents preamplifier impedance ($\Omega$).

In combination with the above expression (I), therefore, it is understood that the power of the reproducing beam may be set at a level of $P_{rep}$ appearing in the following expression in the reproducing method employing the photodetector having a self amplifying function:

$$\frac{SNR \cdot 2eB}{\eta\gamma} \cdot \frac{R_{ave}}{(\Delta R)^2} \leq P_{rep} \leq \frac{kT}{2eBR_{ave}\eta\gamma Z} \left( \text{or } \frac{I_{amp}^2}{2eBR_{ave}\eta\gamma} \right) \quad \text{(II)}$$

When the power of the reproducing beam is set within the above range, it is possible to easily obtain a necessary S-N ratio, although the number of reproducible times is rather reduced as compared with the method according to the first aspect of the present invention.

FIG. 1 shows changes of the reproduced signal output and various noise outputs with respect to the power of the reproducing beam. Referring to FIG. 1, A denotes the lower limit $P_{rep}(\min)$ of the power of the reproducing beam, which is expressed as follows:

$$P_{rep}(\min) = \frac{SNR \cdot 2eB}{\eta\gamma} \cdot \frac{R_{ave}}{(\Delta R)^2}$$

Similarly, B denotes the upper limit $P_{rep}(\max)$ of the power of the reproducing beam, which is expressed as follows:

$$P_{rep}(\max) = \frac{kT}{2eB_{ave}\eta\gamma Z} \left( \text{or } \frac{I_{amp}^2}{2eBR_{ave}\eta\gamma} \right)$$

Generally required is SNR of about 400 (electric power ratio PP/rms=26 dB), and the bandwidth is 1 to 20 MHz. Further, typical values are $R_{ave}=0.75$, $\Delta R \approx 0.5$, $\eta \approx 0.4$ (A/W), and $\gamma=0.9$. Hence, $R_{rep}(\min)$ is about 0.5 to 10 nW, and $P_{rep}(\max)$ is about several $\mu W$ in consideration of employment at ordinary temperatures (up to 300K). According to the second aspect of the present invention, therefore, the range of $P_{rep}$ is about 0.5 nW to several $\mu W$.

The reproducing apparatus according to the third aspect of the present invention is an apparatus which can carry out the reproducing methods according to the first and second aspects of the present invention. In this reproducing apparatus, the power of the reproducing beam emitted from the light source is damped to the power level appearing in the above expression (I) or (II) with the power control means.

In such reduction of the power of the reproducing beam through the reproducing method according to the first or second aspect of the present invention, pickup efficiency is reduced when a part of the reflected reproducing beam entering the detector is separated and employed in an optical system for focus servo or tracking servo control. In this case, the S-N ratio is reduced or the optical power itself is reduced to instabilize the servo control since the reproducing beam having extremely low power is employed as a servo beam.

The reproducing method according to the fourth aspect of the present invention is adapted to solve such a problem. According to this method, a servo beam is prepared independently of the reproducing beam from light of a wavelength band allowing substantially no absorption by a photon mode material contained in the recording layer. Since the servo beam is thus prepared from the light of a wavelength band allowing substantially no absorption by the photon mode material, it is possible to arbitrarily set the power with no reaction of the photon mode material contained in the recording layer, for stabilizing the servo control. Further, reduction of the S-N ratio can be prevented since it is possible to prevent reduction of pickup efficiency with respect to the reproducing beam.

The reproducing apparatus according to the fifth aspect of the present invention is an apparatus which can carry out the reproducing method according to the fourth aspect. When the apparatus according to the fifth aspect of the present invention is employed, it is possible to remarkably improve the number of reproducible times of the optical recording medium without deteriorating stability of focus servo and/or tracking servo control as well as to obtain a reproduced output in an excellent S-N ratio.

The inventors have made deep study on optical density, changes of reflectances following photochromic reaction and the number of reproducible times, to find that the number of reproducible times can be further remarkably improved by optically recording information in an optical recording medium having a reflectance of not more than 0.4 for a reproducing beam in an unrecorded state of its recording layer and reproducing the same along the reproducing method according to the first or second aspect of the present invention.

The relation between the optical density and the reflectance is explained as follows. In the following description, all values described with no units are in MKSA unit systems.

The optical density, also called absorbance (Abs), is expressed as follows:

$$Abs \equiv \epsilon L C$$

where C respesents molar concentration (mol/l) of a photochromic material, L represents the thickness (cm) of a sample, and $\epsilon$ represents a molecular absorption coefficient (l/mol.cm) of the photochromic material.

In this case, absorptivity (Apt) of the sample is expressed as follows:

$$APt = 1 - \exp\{-2.3 \times Abs\}$$
$$= 1 - T$$

$(T = \exp\{-2.3 \times Abs\}$:transmissivity)

A number dn of photons which are absorbed in a time dt when this sample is irradiated with light is expressed as follows:

$$dn = \frac{P \cdot dt}{h\nu} \times Apt$$

where P represents irradiation power (W) of the light, $\nu$ represents c (light velocity)/$\lambda$ (wavelength (mm) of the light), and h represents the Planck's constant.

In the number of photons absorbed by photochromic molecules, the number of reacting molecules is expressed as follows with a quantum yield k:

$$dN = -kdn$$

Considering the quantity of photochromic molecules contained in a unit volume and molar concentration, the following differential equation is obtained:

$$\frac{\partial c}{\partial t} \cdot SLNa \cdot 10^{-3} = -\frac{\lambda}{hc} Pk(1-T)$$

where S represents an area (cm²) irradiated with the light, and Na represents the Avogadro number.

A change of variables C to T with $T=\exp\{-2.3\epsilon Lc\}$ results in the following equation:

$$\frac{\partial T}{\partial t} = \alpha \frac{P\lambda}{S} \cdot \epsilon kT(1-T)$$

$$(\alpha = 1.9 \times 10^4 \, J \cdot m/mol)$$

While the above is a differential equation expressing the relation between an irradiation time t and transmissivity T, a similar change is attained when the irradiation power is increased in place of the irradiation time, for example. Therefore, this equation can be easily generalized to the following differential equation related to a parameter $\beta P$ which is in proportion to an irradiation quantity ($=P \times t$):

$$\frac{\partial t}{\partial(\beta P)} = T(1-T)$$

$$\left( \beta \equiv \alpha \frac{\lambda}{s} t \cdot \epsilon k \right)$$

While this equation is related to transmissivity, a similar equation can be guided also with respect to a reflectance R of an optical recording medium having a reflective layer, as follows:

$$\frac{\partial R}{\partial(\beta P)} = 2R(1-R)$$

The factor 2 on the right side is caused by reciprocation of the light through the recording layer. It is assumed here that the reflectance of the reflective layer is substantially perfect (up to 100%).

This differential equation is applicable to recording and reproduction. In reproduction, P is replaced by a product $n \cdot P_{rep}$ of the reproducing power $P_{rep}$ and the number n of reproducing times and reflectances $R_L$ and $R_H$ of unrecorded and recorded portions are supplied as initial conditions, so that a change of a difference $\Delta R = R_H - R_L$ between the reflectances upon repeated reproduction can be obtained by numerical calculation.

FIG. 14 illustrates a relation between the parameter $\beta P$ and the reflectance R with extremely high optical concentration of an initial condition $R_0=0.01$. While the parameter $\beta P$ shown on the axis of abscissas is in proportion to an irradiation quantity (P·t)×material sensitivity ($\epsilon \cdot k$), this parameter can be regarded as indicating recording power in recording and the number of reproducing times in reproduction, ignoring concrete numerals.

FIGS. 15A to 17C illustrate relations between reflectance differences $\Delta R$ and parameters $\beta P$ under various initial conditions of $R_H$ and $R_L$. FIG. 15A shows a change of the reflectance difference in relation to a reflectance $R_L$ of 0.7 in an unrecorded state and a reflectance $R_H$ of 0.9 in a recorded portion. FIG. 15B shows a change of the reflectance difference in relation to a reflectance $R_L$ of 0.5 in an unrecorded state and a reflectance $R_H$ of 0.9 in a recorded portion. It is clearly understood from FIGS. 15A and 15B that the differences $\Delta R$ are monotonously and abruptly reduced as the parameters $\beta P$ are increased, i.e., as information is repeatedly reproduced. When information recorded in such an optical recording medium is reproduced by the reproducing method according to the first or second aspect of the present invention, the optical recording medium has tens of thousands to hundreds of thousands of reproducible times up to reduction of the output by 3 dB.

FIGS. 16A and 16B show changes of reflectance differences in relation to a case of $R_L=0.35$ and $R_H=0.6$ and a case of $R_L=0.3$ and $R_H=0.5$. Dissimilarly to FIGS. 15A and 15B, the differences $\Delta R$ are not abruptly reduced with increase of the parameters $\beta P$, but initial inclinations are loose or substantially horizontal. This indicates that the numbers of reproducible times are improved several times as compared with those shown in FIGS. 15A and 15B.

FIGS. 17A to 17C show changes of reflectance differences in relation to higher optical concentration values with $R_L=0.1$. Referring to FIG. 17A, the reflectance $R_H$ in the recorded portion is 0.3, i.e., less than 0.4. In this case, the reflectance is reduced after the same is temporarily remarkably increased by repetition of reproduction. Considering that the reproduced output is preferably as stable as possible, such increase in change of the reflectance is unpreferable. When the reflectance $R_H$ is set at 0.6 or 0.8 so that the recorded portion has a reflectance of at least 40%, it is possible to suppress such increase of the reflectance, as shown in FIG. 17B or 17C. Under the conditions shown in FIGS. 17A to 17C, information can conceivably be reproduced about millions of times, i.e., about twice or three times as compared with FIGS. 16A and 16B and about ten times as compared with FIGS. 15A and 15B.

According to the seventh aspect of the present invention, the reproducing beam is prepared from squeezed light having suppressed photon number fluctuation. Description is now made on the reason why noises are reduced through such light.

As hereinabove described, a shot noise is caused by quantum-theoretical fluctuation based on the uncertainty principle. A laser beam is quantum-mechanically explained in a quantum state called a "coherent state", with a photon number which is along Poisson distribution and fluctuation which is in proportion to the square root of the total photon number. Thus, the shot noise has been regarded as impossible to reduce since the same is based on quantum-mechanical fluctuation. However, the "squeezed state" has been recently discovered as a new quantum state of light. According to the uncertainty principle, the product $\Delta A \times \Delta B$ of fluctuation $\Delta A$ of a certain physical value A and fluctuation $\Delta B$ of another physical value B which is conjugated therewith cannot be smaller than the Planck's constant h. In other words, it is possible to reduce the fluctuation $\Delta A$, if the fluctuation $\Delta B$ may be large. Assuming that the physical value A represents a photon number in light, the conjugate physical value B represents the phase of light waves. Therefore, the "coherent state" indicates a quantum state having photon number fluctuation which is equal to phase fluctuation, and the "squeezed state" indicates a quantum state having reduced photon number fluctuation and increased phase fluctuation. When light of a squeezed state having reduced photon number fluctuation and increased phase fluctuation is employed as a reproducing beam, therefore, it is possible to reduce noises below the shot noise level.

The light of a squeezed state having suppressed photon number fluctuation can be obtained by a semiconductor laser into which an excitation current is injected through a resistance of at least twice its differential resistance value, for example. Further, such light of a squeezed state can be generated by a method utilizing parametric oscillation with a nonlinear optical material, for example.

According to the eighth aspect of the present invention, light of a squeezed state having suppressed photon number fluctuation is employed as a reproducing beam at a power level within the range of $P_{rep}$ (W) appearing in the above expression (III). Therefore, it is possible to improve the number of reproducible times, while it is also possible to ensure a required S-N ratio even if the number of reproducible times is improved. Thus, such a reproducing method is useful when the number of reproducible times is to be preferentially improved as compared with the S-N ratio.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a spectral diagram showing transmissivity of a dichroic mirror employed in Example;

FIGS. 17A to 17C illustrate relations between reflectances $R_L$ and $R_H$ in unrecorded states and recorded portions of recording layers with respect to reproducing beams and parameters $\beta P$ serving as measures of numbers of repeated reproducing times;

DESCRIPTION OF THE PREFERRED EMBODIMENTS

Figure 1:
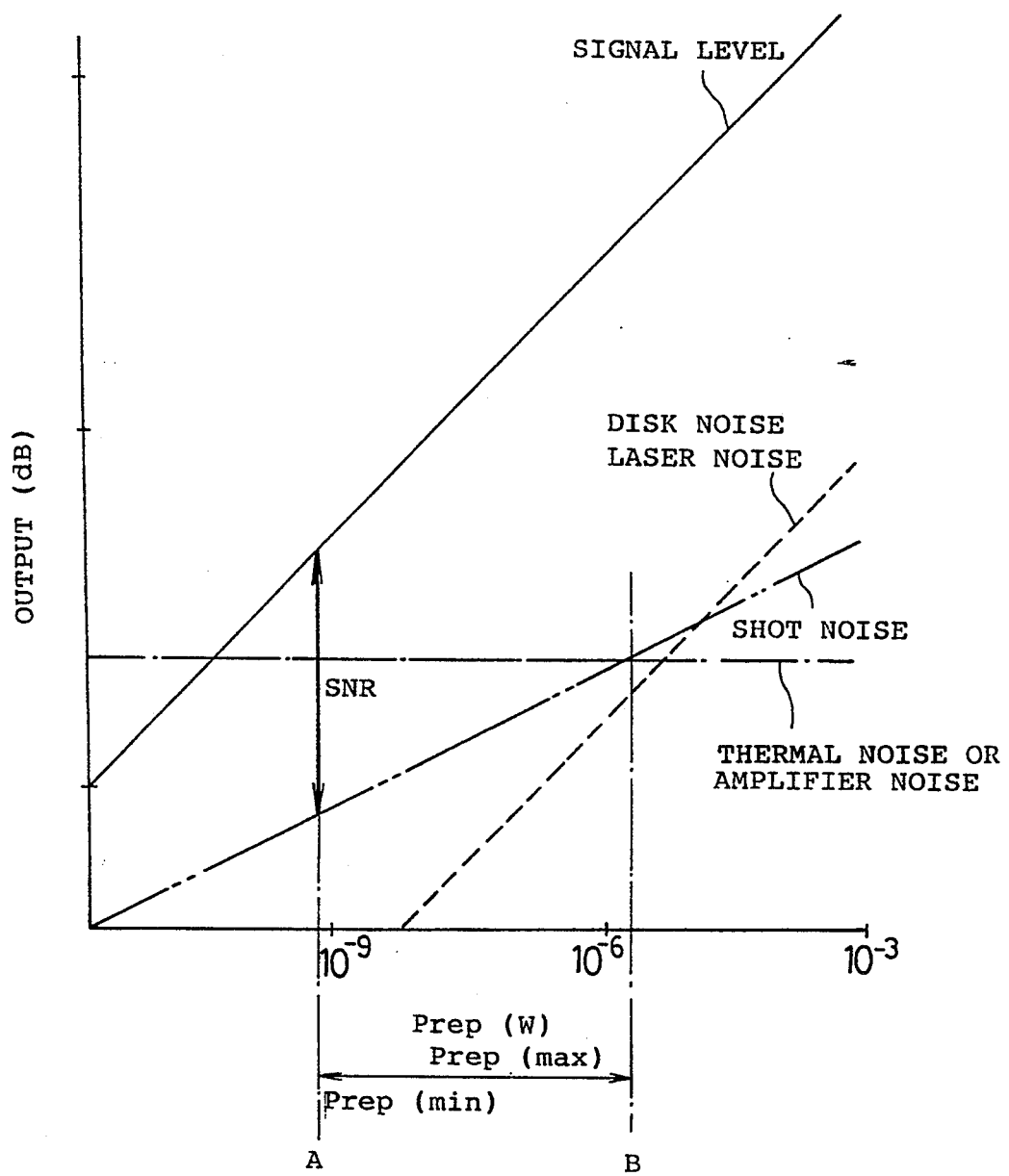
FIG. 1 illustrates relations between power of a reproducing beam and a signal output level and various noise levels.
Figure 2:
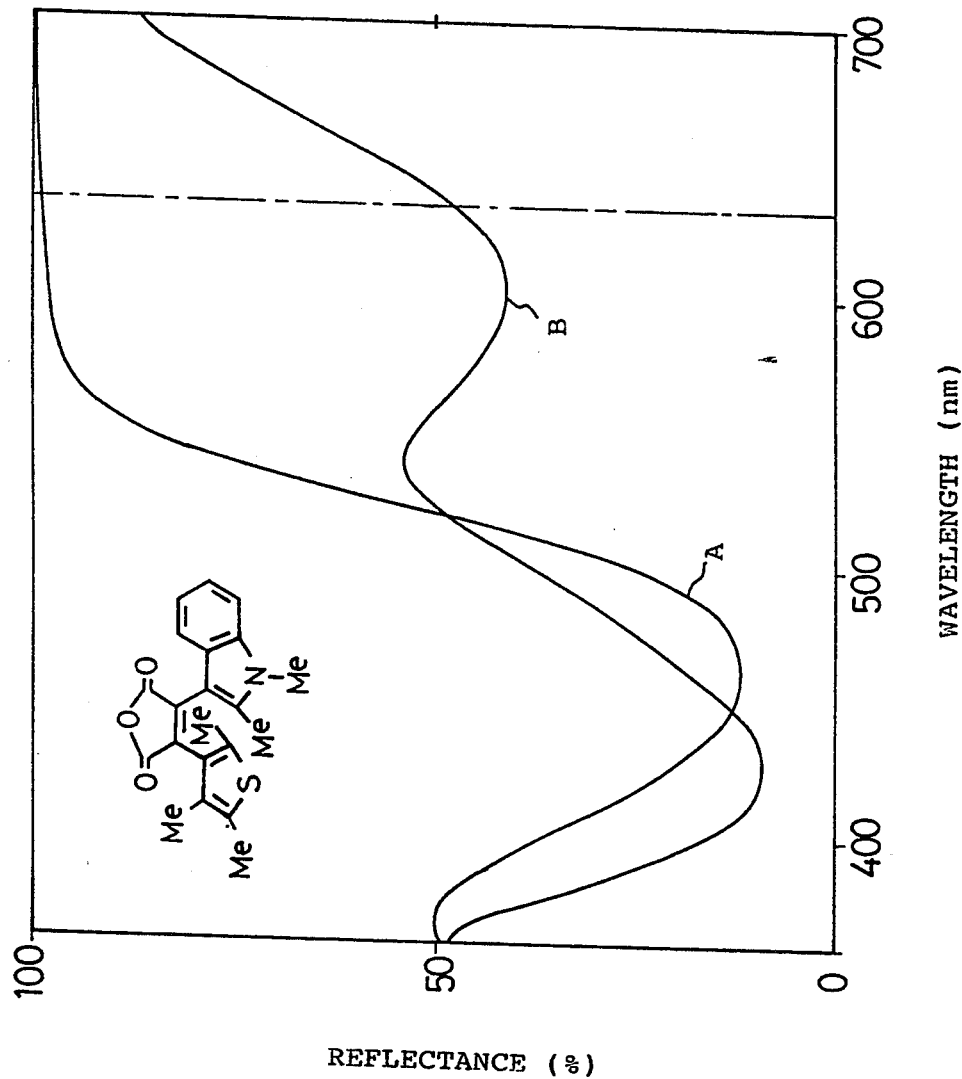
FIG. 2 illustrates a molecular structure of a photochromic material employed in Example of the present invention and spectral reflectances of an optical recording medium formed by the photochromic material.

FIG. 2 illustrates the molecular structure of a diarylethene photochromic material employed in Example of the present invention, and reflectances of recorded and unrecorded portions of the photochromic material. When the photochromic material is irradiated with light in the vicinity of 460 nm in wavelength in a state A having an absorption maximum in the vicinity of the wavelength of 460 nm, this photochromic material is converted to a state B having a new absorption maximum in the vicinity of a wavelength of 600 nm. When irradiated with light of about 550 to 700 nm in wavelength in the state B, on the other hand, the photochromic material returns to the original state A. Therefore, it is possible to record information by previously bringing this photochromic material into the state B and irradiating the same with a laser beam of about 600 nm in wavelength with strong power. Further, it is possible to reproduce the information by irradiating the photochromic material with a reproducing beam of very low power and detecting a change in reflectance in the same wavelength band.

Figure 3:
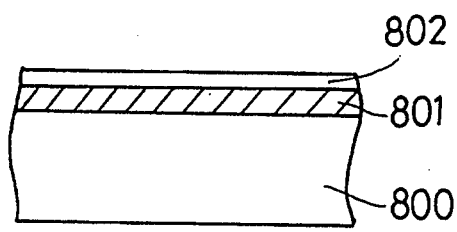
FIG. 3 is a sectional view showing the structure of the optical recording medium employed in Example.

25 percent by weight of this photochromic material was mixed into polyvinyl butyral resin. This mixture was dissolved in a mixed solution of anone and benzene, spin-coated on a glass disk substrate and dried, to form a recording layer of about 1 μm in thickness. Then, an Ag film was formed thereon by vacuum deposition, to define a reflective film. FIG. 3 is a sectional view showing the obtained optical recording medium. A recording layer 801 is formed on a glass disk substrate 800, and an Ag reflective film 802 is formed thereon. This optical recording medium exhibited a reflectance of $R_{ave} \approx 0.75$ at $\lambda = 630$ nm with $\Delta R \approx 0.5$, as shown in FIG. 2.

A recording method according to the first aspect of the present invention and a corresponding recording apparatus according to the third aspect of the present invention are now described.

Figure 4:
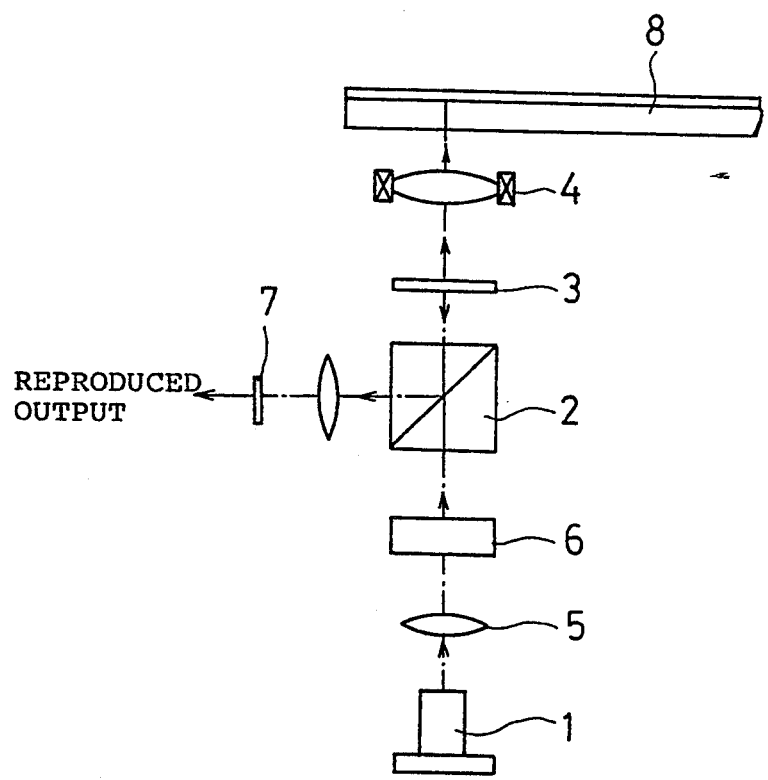
FIG. 4 is a block diagram showing an embodiment of a reproducing apparatus according to the third aspect of the present invention.

FIG. 4 is a model diagram showing an embodiment of the reproducing apparatus according to the third aspect of the present invention. Referring to FIG. 4, a reproducing beam which is emitted from a semiconductor laser 1 passes through a collimator lens 5, a power control element 6, a polarized beam splitter 2, a quarter-wave plate 3 and an objective lens 4, to be applied to an optical recording medium 8. The reproducing beam passing through a recording layer and being reflected by a reflective film passes again through the objective lens 4 and the quarter-wave plate 3, to be reflected by the polarized beam splitter 2 and detected by a photodetector 7 through a lens. According to this embodiment, the semiconductor laser 1 is prepared from that emitting a laser beam of 630 nm in wavelength. On the other hand, the photodetector 7 is prepared from an avalanche photodiode having a self amplifying function for a photocurrent. While the reproducing beam is set at an extremely low power level of not more than 1 μW according to the present invention, it is difficult to stably drive light which is emitted from a semiconductor laser with such very low power. According to this embodiment, therefore, the semiconductor laser 1 is set to emit power of about 1 mW at a constant level, so that the power of the reproducing beam is damped to a level of several 10 nW, i.e., not more than 1 μW, by the power control element 6 such as an ND filter.

In order to record information in an optical recording medium with the apparatus shown in FIG. 4, the power of the semiconductor laser 1 may be increased to a high level of about 10 mW, for example, to modulate the intensity in response to a recording signal, or the power control element 6 may be removed from the optical path in recording.

Further, the power control element 6 may be prepared from a liquid crystal modulator etc. which can change transmissivity in response to an external recording/reproducing mode switching signal.

Figure 5:
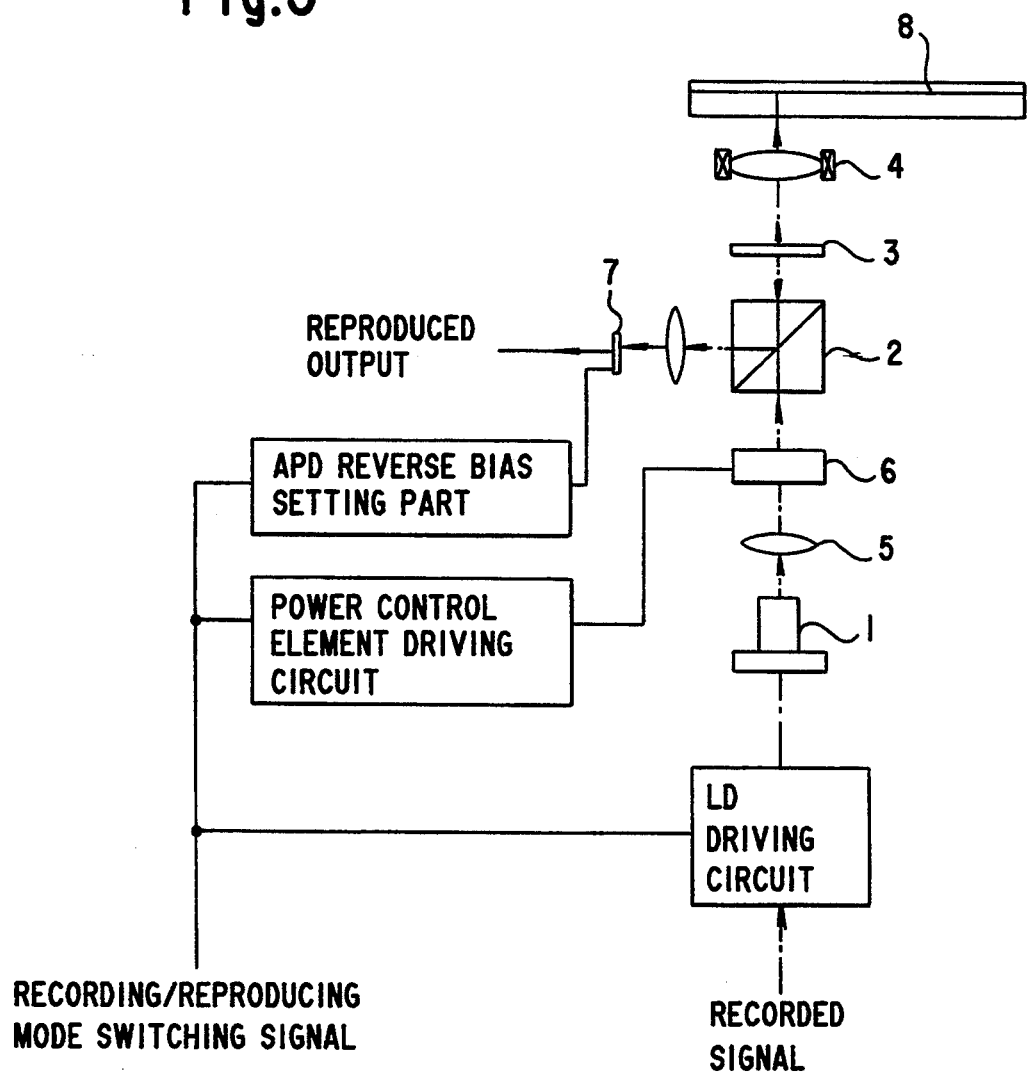
FIG. 5 is a block diagram showing another embodiment of the reproducing apparatus according to the third aspect of the present invention.

FIG. 5 shows an apparatus which is provided with such a power control element 6. In such an apparatus, the quantity of light reaching an avalanche photodiode (APD) is increased in a recording mode. In order to prevent an overcurrent from flowing, therefore, it is preferable to provide a setting circuit for reducing a reverse bias voltage which is applied to the APD and lowering its gain in a recording mode. Referring to FIG. 5, such a circuit is provided as an APD reverse bias setting part. Each of the apparatuses shown in FIGS. 4 and 5 was employed for reproducing information. Under conditions of pickup efficiency γ of 0.6, sensitivity η of the APD of 0.4 (A/W) with respect to a gain 1, a system bandwidth of 10 MHz and a required S-N ratio of 26 dB, the reproducing beam has power of 16 nW from the above expression (I). The reproducing beam was set at such a very low power level through the power control element 6, to reproduce information. Consequently, an excellent S-N ratio was obtained with an APD gain of 100 times, and the information was reproduced 150,000 times when a signal output was reduced by 3 dB.

For the purpose of comparison, information was reproduced with a reproducing beam at a power level of 1 mW. In this case, the information was reproduced only 10 times when the reproduced output was reduced by 3 dB.

It is clearly understood from the above that the number of reproducible times can be improved at least 10,000 times by employing the reproducing method according to the first aspect of the present invention.

Although the photodetector having a self amplifying function is prepared from an APD in each of the aforementioned embodiments, the present invention is not restricted to this but a photodetector of a coherent optical detection system can also be employed.

A reproducing method according to the second aspect of the present invention and a corresponding reproducing apparatus according to the third aspect are now described.

The reproducing apparatus shown in FIG. 4 was employed with pickup efficiency γ of 0.9.

A reproduced signal was evaluated as follows: The system bandwidth was set at 10 MHz, and a signal of 1 MHz was recorded and reproduced to measure a C-N ratio at RBW=30 kHz. This C-N ratio was converted to an S-N ratio along S-N ratio=C-N ratio×(30 kHz/10 MHz). As to a photodetector for such reproduction, a generally employed Si-PIN.PD and an avalanche photodiode (Si-APD) were employed and compared with each other. Numbers of reproducible times were compared through points where reproduced outputs were reduced by 3 dB.

When the signal was reproduced with reproducing power of 10 nW, the apparatus exhibited an extremely inferior S-N ratio of 4 dB through the photodetector of PIN. PD. When the photodetector was replaced by the APD, on the other hand, the S-N ratio was improved to 27 dB. At this time, it was possible to reproduce the signal 500,000 times.

Then, the signal was reproduced with reproducing power of 800 nW, whereby the apparatus exhibited a relatively excellent S-N ratio of 21 dB through PIN. PD. When the photodetector was replaced by the APD, the S-N ratio was further improved to 28 dB. At this time, it was possible to reproduce the signal about 10,000 times.

When the signal was reproduced with reproducing power of 5 μW, the apparatus exhibited the same S-N ratio of 27 dB through both of the PIN. PD and the APD, substantially with no effect of improvement in S-N ratio through employment of the APD. At this time, it was possible to reproduce the signal about 2,000 times.

When the signal was reproduced with reproducing power of 0.1 mW, further, the S-N ratio remained at 27 dB through both of the PIN. PD and the APD. However, the number of reproducible times was reduced to about 50.

As clearly understood from the above results, a photodetector having a self amplifying function such as an APD attains an effect of improvement in S-N ratio when the reproducing power is not more than several μW. In consideration of improvement in number of reproducible times, the reproducing power is preferably closer to the lower limit $P_{rep}(min)$ than the upper limit $P_{rep}(max)$.

A reproducing method according to the fourth aspect of the present invention and a reproducing apparatus according to the fifth aspect of the present invention are now described.

Figure 6:
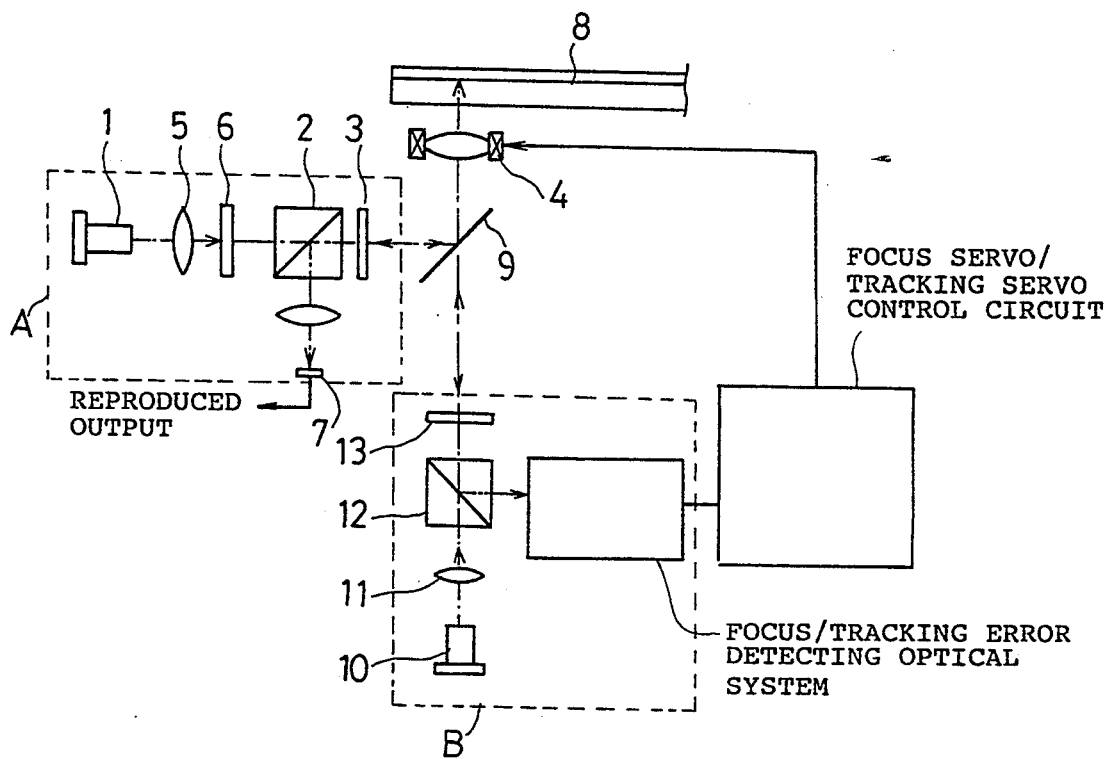
FIG. 6 is a block diagram showing a first embodiment of a reproducing apparatus according to the fourth and fifth aspects of the present invention.

FIG. 6 is a model diagram showing a first embodiment of the reproducing apparatus according to the fifth aspect of the present invention. In the reproducing apparatus shown in FIG. 6, a reproducing optical system A is so combined with a servo optical system B that a reproducing beam from the former is synthesized with a servo beam from the latter by a dichroic mirror 9, which is a beam synthesis means, and the synthesized beam is converged on a optical recording medium 8 by an objective lens 4.

Figure 7:
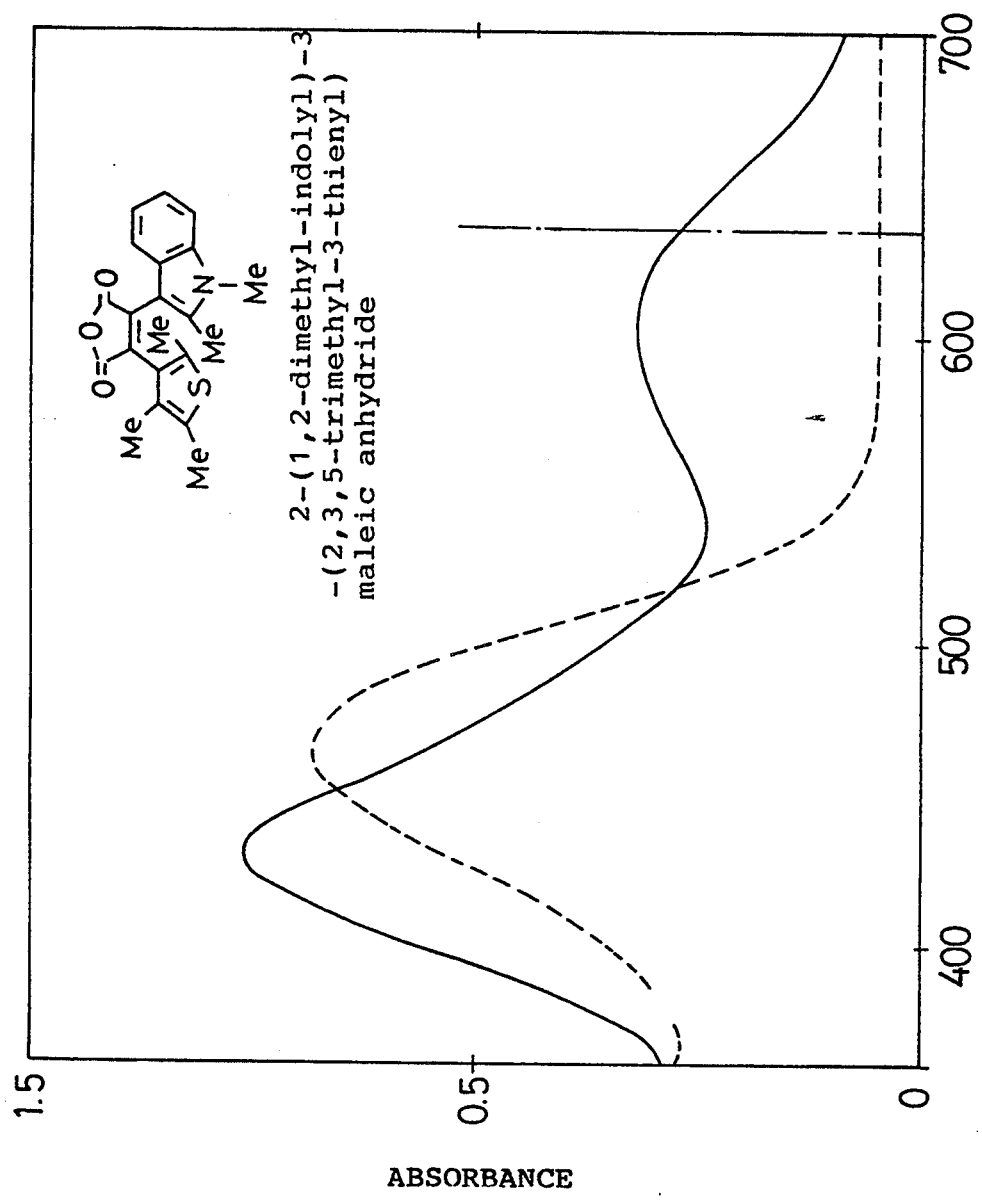
FIG. 7 illustrates a molecular structure of a photochromic material employed in Example and its absorption spectra.

FIG. 7 illustrates absorbance levels of a 2-(1,2-dimethyl-3-indolyl)-3-(2,3,5-trimethyl-3-thienyl) maleic anhydride, which is employed as a photochromic material in the optical recording medium 8, at respective wavelengths. These spectra are in correspondence to FIG. 2, which shows reflectances of the same compound. As clearly understood from FIG. 7, this photochromic material has a relatively large absorption change in the vicinity of a wavelength of 630 nm. Thus, a reproducing light source 1 can be prepared from a visible light emitting semiconductor laser which can emit a laser beam of about 630 nm in wavelength.

Referring again to FIG. 6, light emitted from the light source 1 is shaped by a collimator lens 5, and converted to a reproducing beam of very low power by a power control element 6. The power control element 6 can be formed by an ND filter, for example. The power of the reproducing beam emitted from the light source 1, which is of the order of several mW, is extremely damped by such an ND filter which is 1/1,000,000 to 1/1000 in transmissivity. The reproducing beam whose power is damped by the power control element 6 passes through a polarized beam splitter 2 and a quarter-wave plate 3 and is reflected by the dichroic mirror 9, to be converged on the optical recording medium 8 through the objective lens 4.

The reproducing beam passing through a recording layer and is reflected by a reflective film backwardly travels along the same optical path, and is reflected by the polarized beam splitter 2, to be photoelectrically converted and detected by a photodetector 7. This photodetector 7 is formed by an avalanche photodiode having a self-amplifying function for a photocurrent, as described above.

On the other hand, a servo light source 10 is formed by a near infrared semiconductor laser of 780 nm in wavelength, which is in a wavelength band allowing no absorption by the photochromic material. The light source 10 emits a beam with power of about 1 mW, in order to stabilize servo control. This beam is shaped by a collimator lens 11, passes through a polarized beam splitter 12 and a quarter-wave plate 13, and is transmitted through the dichroic mirror 9 to be converged on the optical recording medium 8 through the objective lens 4. The servo beam which is reflected in the optical recording medium 8 backwardly travels along the same optical path and is reflected by the polarized beam splitter 12, to be converted to a focus error signal or a tracking error signal by a focus/tracking error detection optical system. This focus/tracking error detection optical system can be prepared from a well-known system. A focus servo/tracking servo control circuit drives the objective lens 4 on the basis of the error signal, to carry out focus servo or tracking servo control.

Figure 8:
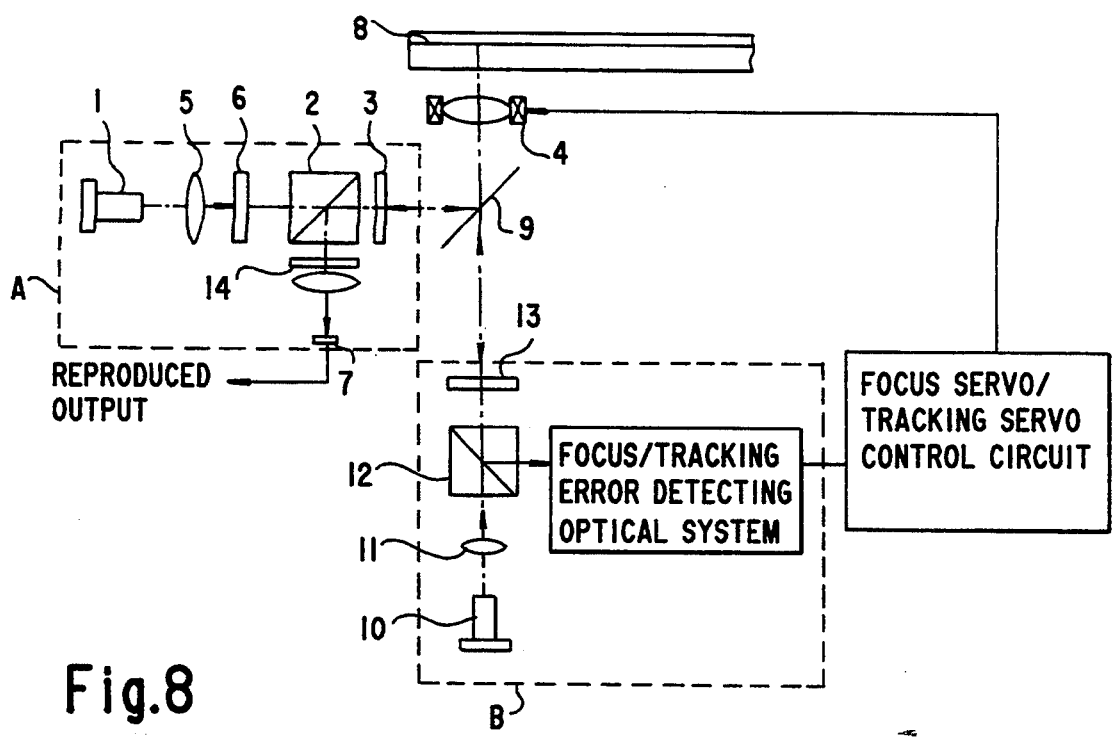
FIG. 8 is a block diagram showing a second embodiment of the reproducing apparatus according to the fifth aspect of the present invention.

FIG. 8 is a model diagram showing a second embodiment of the reproducing apparatus according to the fifth aspect of the present invention. This embodiment is different from that shown in FIG. 6 in a point that a filter 14 is provided between a polarized beam splitter 2 and a photodetector 7 in a reproducing optical system A. In other structure, this embodiment is identical to that shown in FIG. 6, and hence corresponding parts are denoted by the same reference numerals to omit redundant description. The filter 14 is adapted to eliminate light in a wavelength band of a servo beam, to transmit only light in a wavelength band of a reproducing beam. The reason why such a filter is provided is now described.

When a reproducing beam of the nW order is employed, the quantity of light which is reflected from an optical recording medium 8 to reach the photodetector 7 is also of the nW order. On the other hand, a semiconductor laser 10, which serves as a servo light source, has intensity of the order of 1 mW, and intensity of the servo beam which is reflected by the optical recording medium 8 to enter the dichroic mirror 9 is also of the order of about 1 mW. The dichroic mirror 9 has a property of reflecting light of the wavelength ($\lambda$=630) of the reproducing beam while transmitting light of the wavelength ($\lambda$=780 nm) of the servo beam. However, while its transmissivity for the light of $\lambda$=630 nm in wavelength is substantially 0% as shown in FIG. 9, it is difficult to transmit the light of $\lambda$=780 nm in wavelength by 100%, and about several % of this light is reflected to enter the reproducing optical system A. If the apparatus shown in FIG. 8 is provided with no filter 14, a servo beam having intensity of about several 10 μW inevitably enters the photodetector 7 due to the reflectance of several % of the dichroic mirror 9. This forms light of 10,000 times the reproducing beam in intensity, leading to not only increase of a dc component in a reproduced output current but remarkable influence of noises caused by the servo beam.

In order to solve this problem, the filter 14, such as an interference filter which transmits the reproducing beam with extremely low transmissivity for the servo beam, may be provided in any portion between the dichroic mirror 9 and the photodetector 7. According to this embodiment, therefore, the filter 14 is provided between the polarized beam splitter 2 and the photodetector 7.

Figure 10:
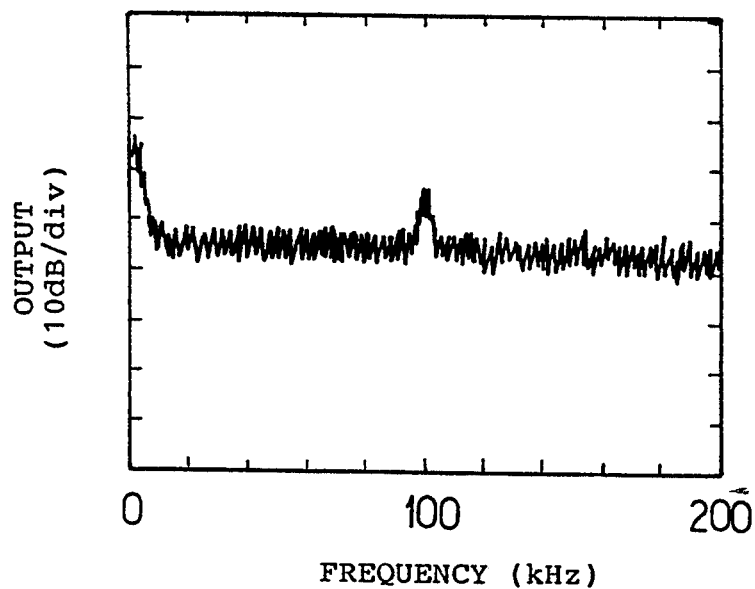
FIG. 10 illustrates a reproduction C-N ratio in Example employing no filter.

FIG. 10 illustrates a reproduction C-N ratio of an apparatus provided with no filter, with a reproducing beam of 10 nW in power and a servo beam of 10 mW in power. As shown in FIG. 10, the apparatus provided with no filter exhibits an extremely inferior C-N ratio of 10 dB.

Figure 11:
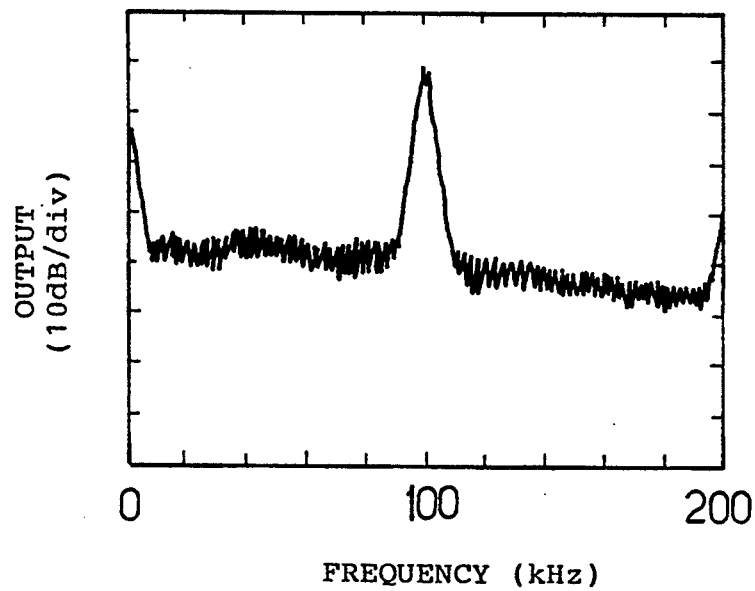
FIG. 11 illustrates a reproduction C-N ratio in Example employing a filter.

On the other hand, FIG. 11 shows a reproduction C-N ratio of an apparatus provided with a filter. As shown in FIG. 11, this apparatus exhibits an excellent C-N ratio of about 40 dB.

Figure 12:
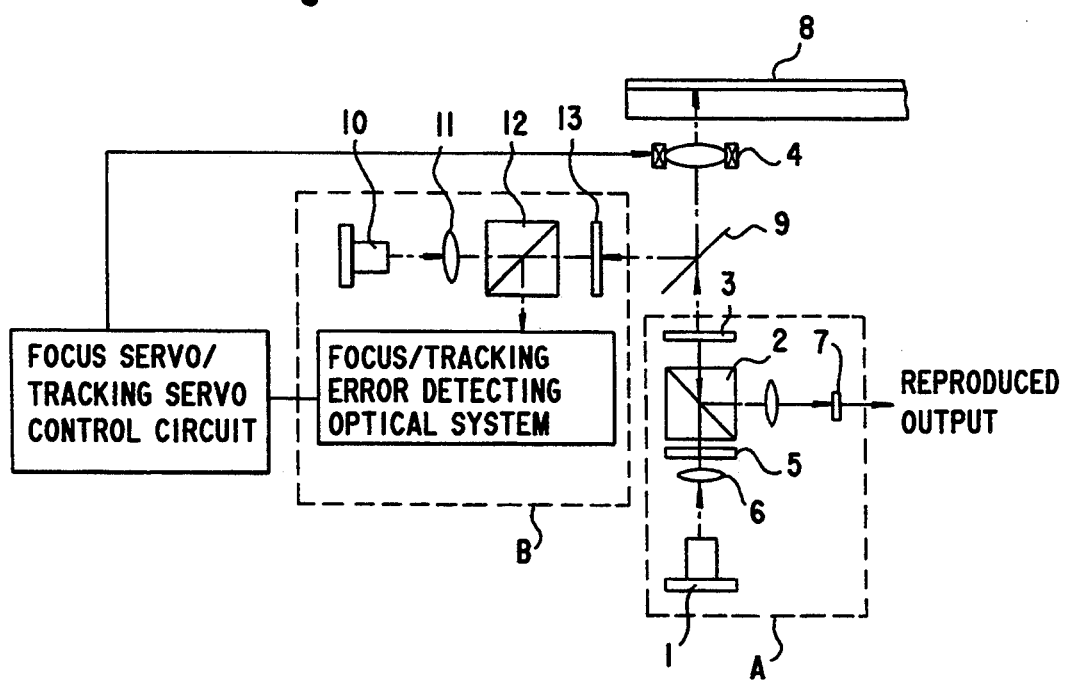
FIG. 12 is a model diagram showing a third embodiment of the reproducing apparatus according to the fifth aspect of the present invention.

FIG. 12 is a model diagram showing a third embodiment of the reproducing apparatus according to the fifth aspect of the present invention. This embodiment shows an optical system which solves the aforementioned problem by changing a dichroic mirror 9 in design. Since the dichroic mirror 9 can be designed substantially at 100% with respect to reflection as hereinabove described, a servo beam is reflected by the dichroic mirror 9 to be converged on an optical recording medium in an optical system according to this embodiment. Due to such a structure, it is possible to extremely reduce an amount of the servo beam entering a reproduction optical system. Further, it is possible to reduce the cost since no filter is required. However, the S-N ratio is slightly reduced due to loss of a reproducing beam caused in the dichroic mirror 9.

Figure 13:
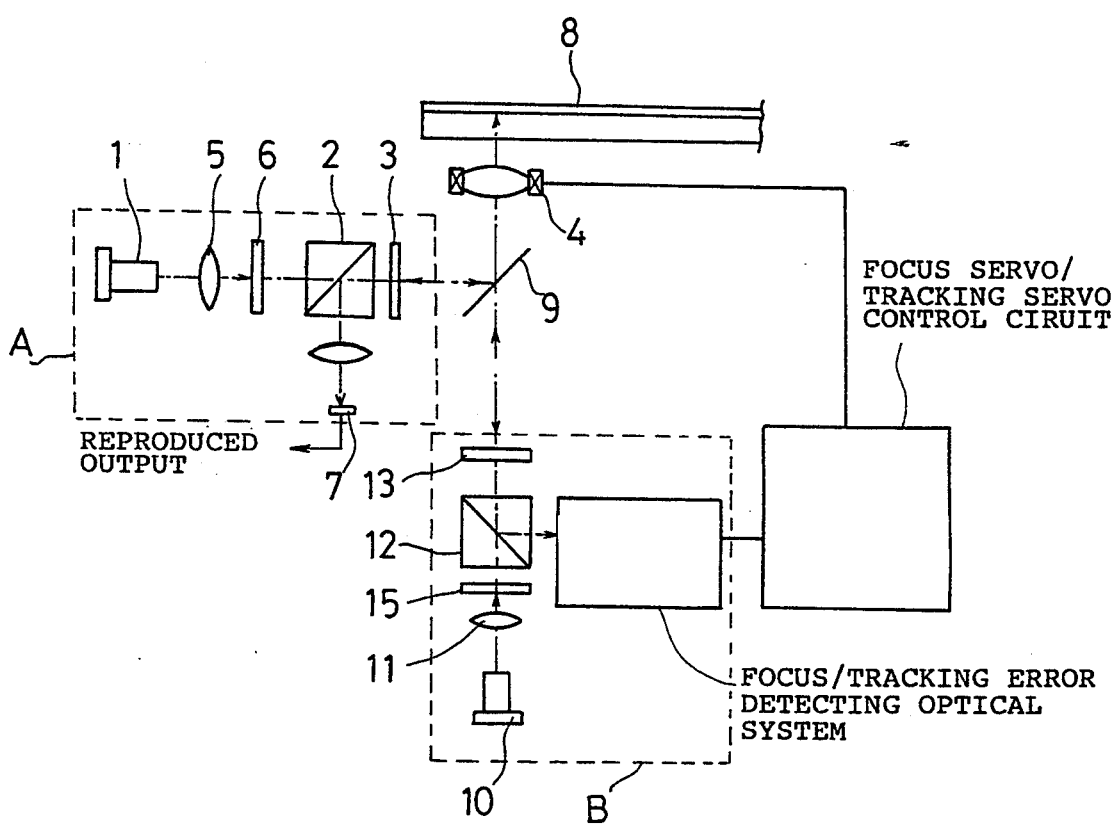
FIG. 13 is a model diagram showing a fourth embodiment of the reproducing apparatus according to the fifth aspect of the present invention.
Figure 14:
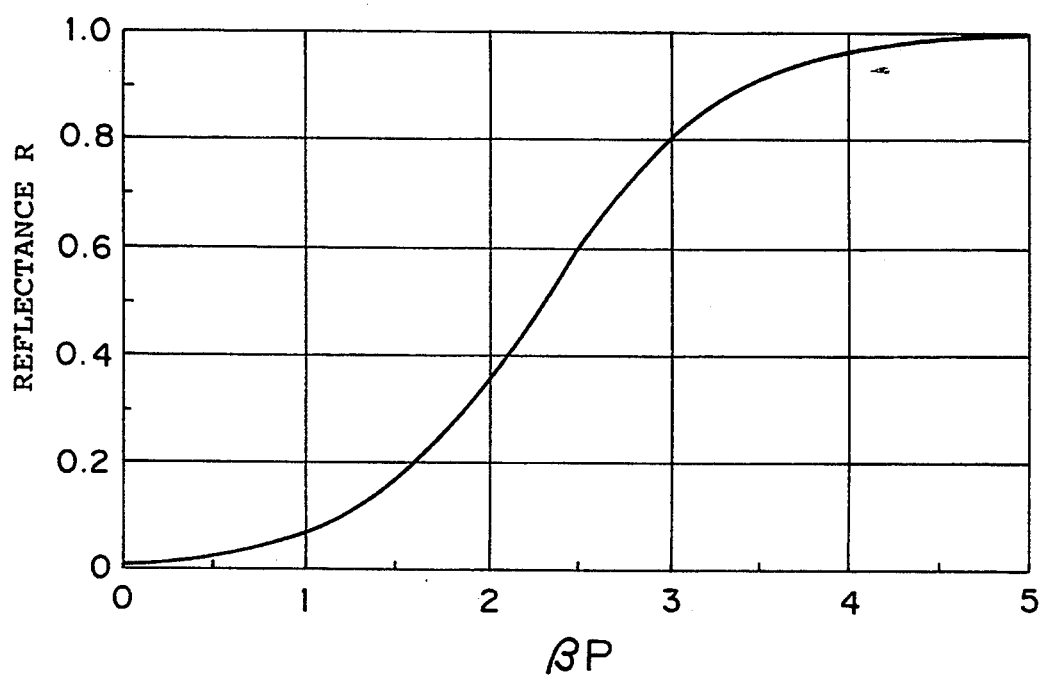
FIG. 14 illustrates a relation of an irradiation quantity and a reflectance level to a photon mode medium.
Figure 15A:
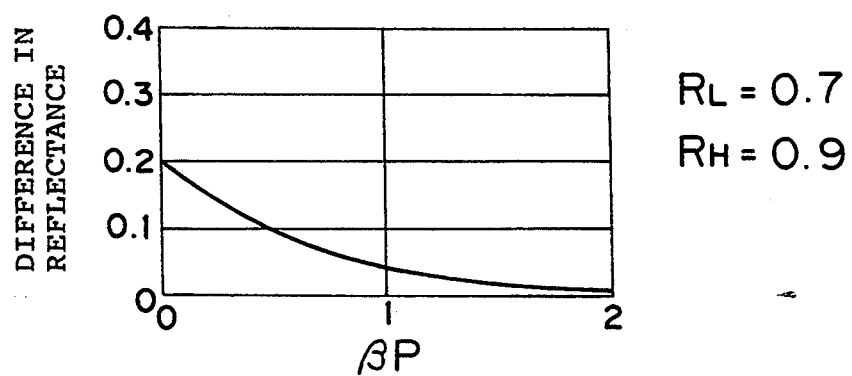
FIGS. 15A and 15B illustrate relations between reflectances $R_L$ and $R_H$ in unrecorded states and recorded portions of recording layers with respect to reproducing beams and parameters $\beta P$ serving as measures of numbers of repeated reproducing times.
Figure 15B:
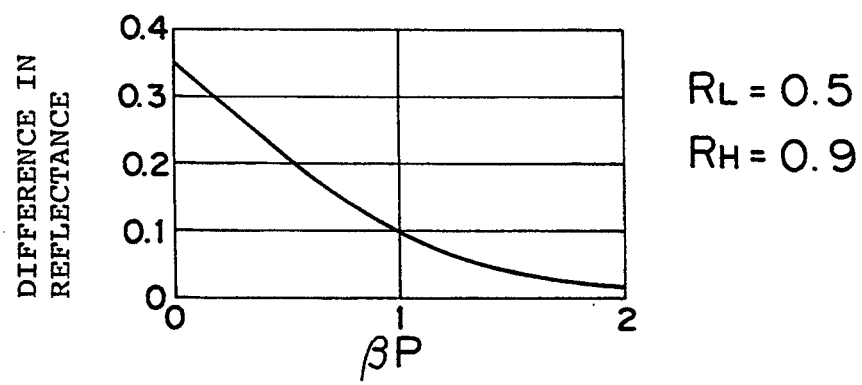
Figure 16A:
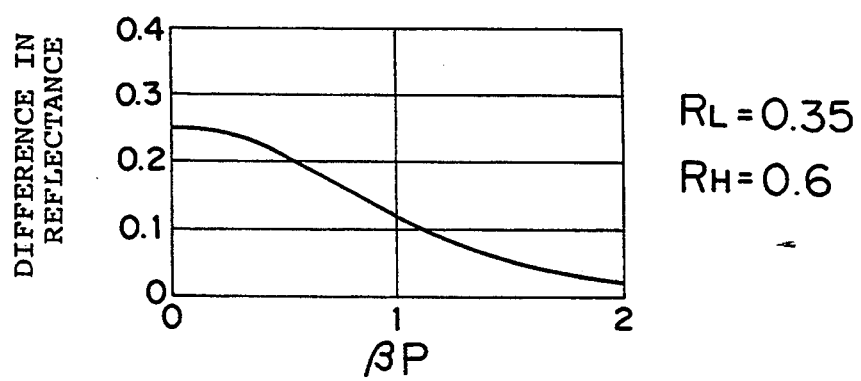
FIGS. 16A and 16B illustrate relations between reflectances $R_L$ and $R_H$ unrecorded states and recorded portions of recording layers with respect to reproducing beams and parameters $\beta P$ serving as measures of numbers of repeated reproducing times.
Figure 16B:
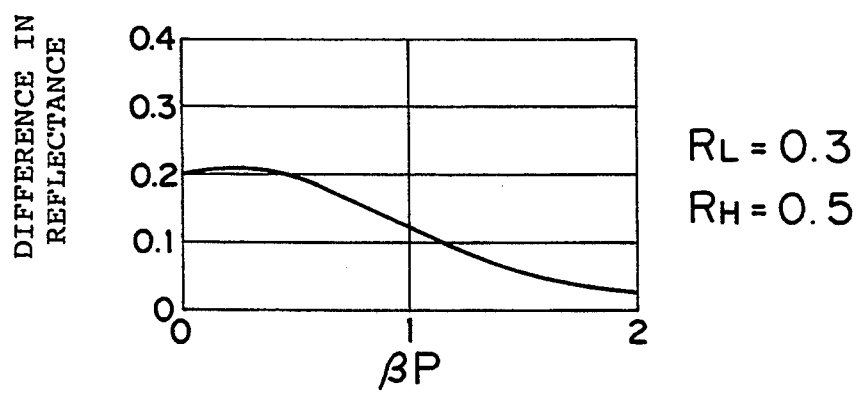

FIG. 13 is a model diagram showing a fourth embodiment of the reproducing apparatus according to the fifth aspect of the present invention. This embodiment is different from that shown in FIG. 6 in a point that a filter 15 is provided between a collimator lens 11 and a polarized beam splitter 12 in a servo optical system B. This filter 15 is adapted to eliminate light emitted from a semiconductor laser light source 10, which is at a wavelength other than that of a servo beam. This filter 15 is provided for the following reason:

The light emitted from the semiconductor laser light source 10 includes a laser beam generated by laser oscillation at a near infrared wavelength and a non-laser light component generated by spontaneous emission, which is lower in intensity than the laser. In general, a non-laser light component has a wavelength of a visible region, which is shorter than that of a laser light component. Even servo control is carried out through a laser beam of a wavelength band allowing no absorption by the photochromic material, therefore, photochromic molecules may cause reaction to damage recorded information due to the non-laser light component generated by spontaneous emission. In order to solve this problem, the filter 15 is provided in this embodiment to transmit only the laser light component and eliminate the non-laser light component in the light emitted from the light source 10.

While each of the embodiments shown in FIGS. 8 and 13 employs a filter as wavelength selection means, such a filter may be replaced by an element such as a polarized beam splitter or a quarter-wave plate which is coated with a dielectric multilayer film and provided with a function similar to that of the filter.

Description is now made on Experimental Example of optical recording media having values $R_L$ shown in FIG. 3, which were prepared from the diarylethene photochromic material shown in FIG. 7 with reflective layers of Ag and recording layers containing polystyrene to be subjected to measurement of numbers of reproducible times.

The overall surface of each optical recording medium was previously sufficiently irradiated with blue light and brought into the state shown by the solid line in FIG. 7. Then the optical recording medium was irradiated with an HeNe laser beam of 633 nm in wavelength, the intensity of which was modulated with relatively strong power, for optically recording information. Thereafter the medium was dc-irradiated with light of the same wavelength with very low reproducing power, for detecting a change of the reflectance level and reproducing the information.

Figure 18:
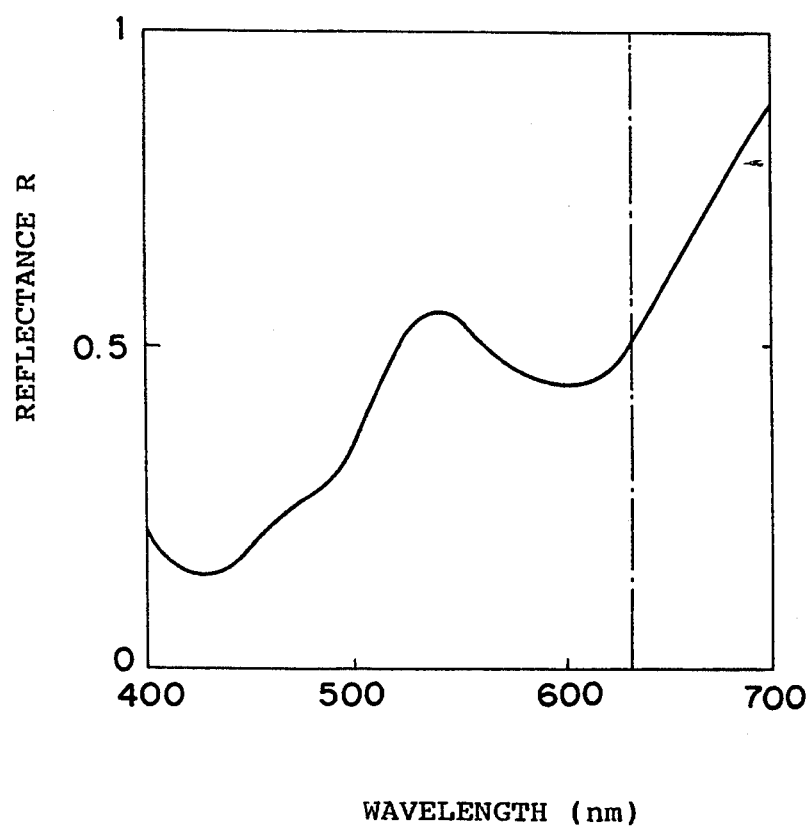
FIG. 18 illustrates spectral reflectances of an optical recording medium having a reflectance $R_L$ of 0.5.
Figure 19:
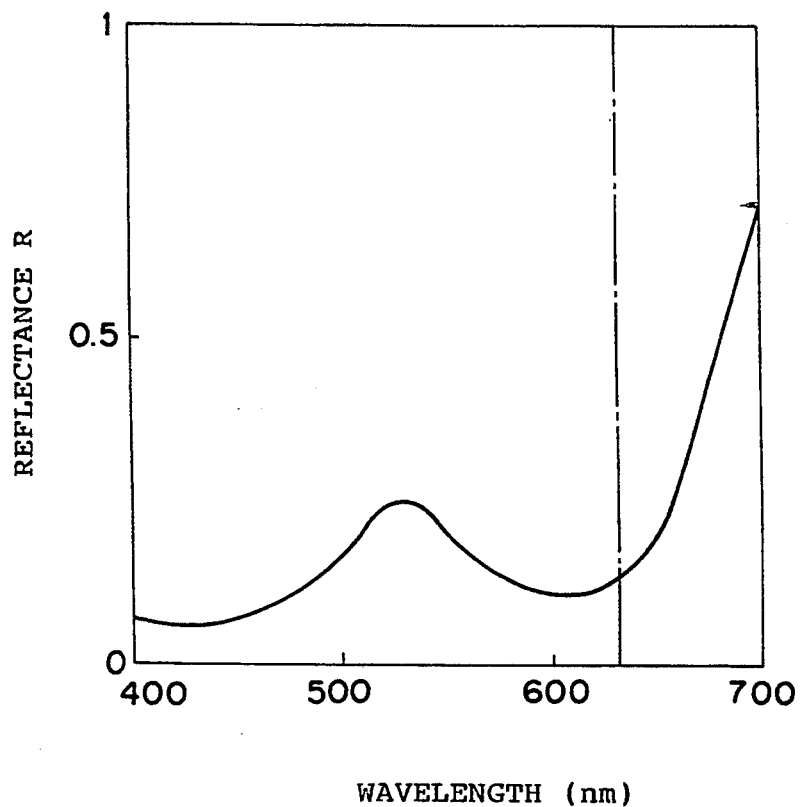
FIG. 19 illustrates spectral reflectances of an optical recording medium having a reflectance $R_L$ of 0.13.

FIG. 18 illustrates spectral reflectances of the optical recording medium of $R_L=0.5$ having relatively low optical concentration, and FIG. 19 illustrates those of an optical recording medium of $R_L=0.13$ having relatively high optical concentration.

Photoelectric conversion was performed through an avalanche photodiode having a self amplifying function for a photocurrent, to carry out current-to-voltage conversion of an amplified photocurrent with a high band/low bias current operational amplifier.

In an optical system employed for such measurement, the avalanche photodiode had sensitivity of $\eta=0.4$ (A/W) with respect to a gain 1, and pickup efficiency, indicating a rate of reflected light from the medium coupling with the photodiode, was set as $\gamma=0.8$.

A linear velocity of a disk was set at 5 m/sec. in all measurement. Assuming that the minimum recorded portion is about 1.2 $\mu$m in length with a reproducing laser spot diameter of about 1.2 $\mu$m, the system has a bandwidth W corresponding to about 2.1 MHz. While the length of the minimum recorded portion may be smaller than the above value, the bandwidth may be derived from the length of the recorded portion in this case.

Assuming that a required S-N ratio is 26 dB, a required C-N ratio measured with RBW of 30 kHz, resulting from S-N ratio=C-N ratio$\times$(30 kHz/w), is as follows:

C-N ratio=26 dB+18 dB=44 dB

The C-N ratio was measured with respect to a recorded signal of 1 MHz.

Description is now made on Experimental Examples of optical recording media having various optical concentration levels to be subjected to measurement of numbers of reproducible times.

<EXAMPLE 1>

Information was optically recorded in an optical recording medium having an initial reflectance $R_L$ of 0.79 at $\gamma=633$ nm, with recording power of 10 mW. At this time, a recorded portion exhibited a reflectance $R_H$ of about 1, with a reflectance change $\Delta R$ of 0.21 and an average reflectance $R_{ave}$ of 0.90.

Comparative Example 1-1

Figure 20:
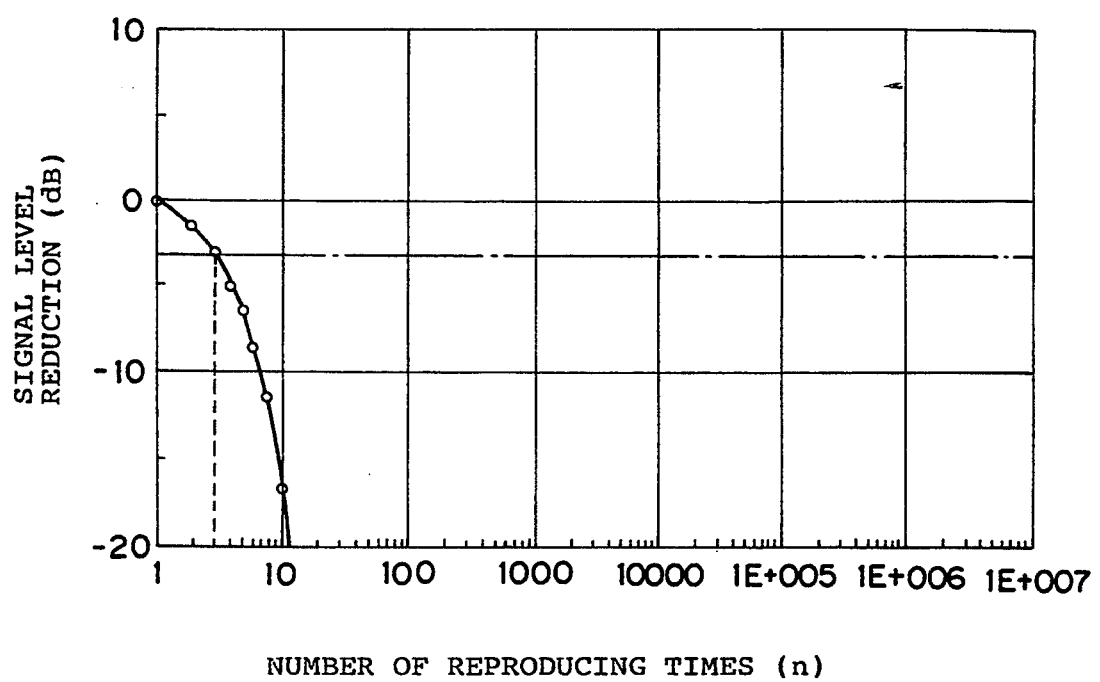
FIG. 20 illustrates a relation between a number of reproducing times and an amount of signal level reduction in comparative example 1-1.

The information was reproduced at $P_{rep}=0.5$ mW, which is a lower limit of reproducing power of about 1/5 to 1/20 of recording power generally employed in a heat mode optical recording medium etc. The resultant initial C-N ratio was 49 dB. FIG. 20 shows C level reduction in repetition. As clearly understood from FIG. 20, it was possible to reproduce the information only three times.

EXAMPLE 1-1

Figure 21:
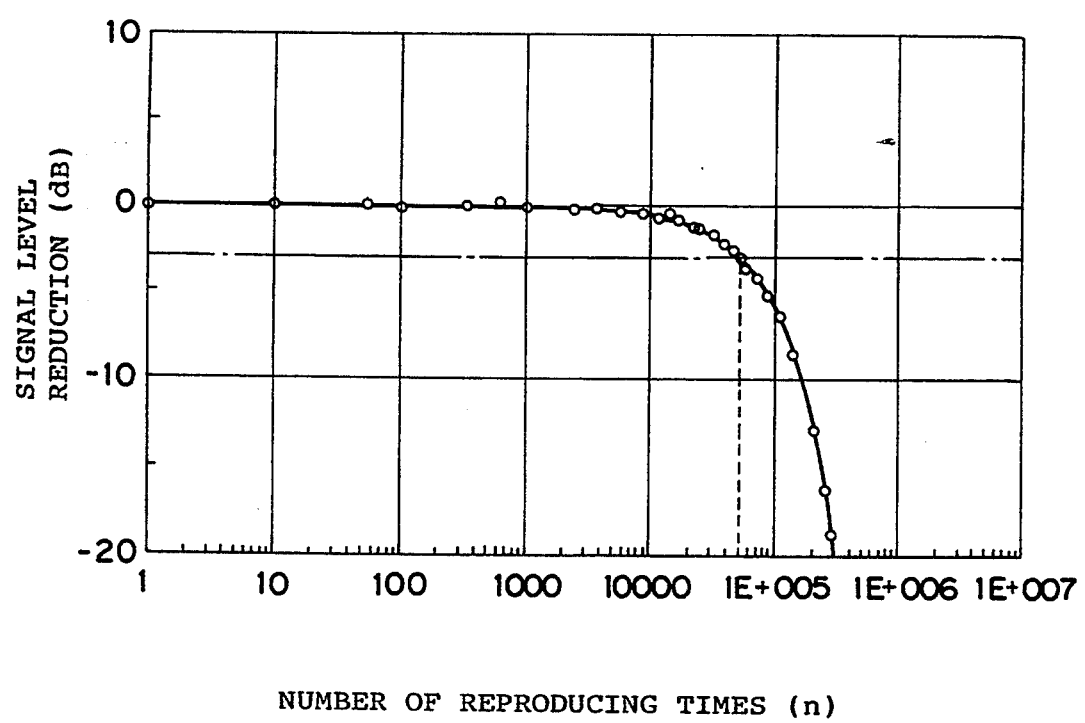
FIG. 21 illustrates a relation between a number of reproducing times and an amount of signal level reduction in Example 1-1.

The information was reproduced with reproducing power $P_{rep}=18$ nW, which was within the range according to the first aspect of the present invention. The resultant initial C-N ratio was 48 dB. FIG. 21 shows C level reduction in repeated reproduction. As clearly understood from FIG. 21, it was possible to reproduce the information about 50,000 times.

<Example 2>

An optical recording medium having an initial reflectance $R_L$ of 0.5 at $\lambda=633$ nm, to record information with recording power of 10 mW. This optical recording medium was similar to that shown in FIG. 18. A recorded portion exhibited a reflectance $R_H$ f 0.98, with a reflectance change $\Delta R=0.48$ and an average reflectance $R_{ave}$ of 0.74.

Comparative Example 2-1

Figure 22:
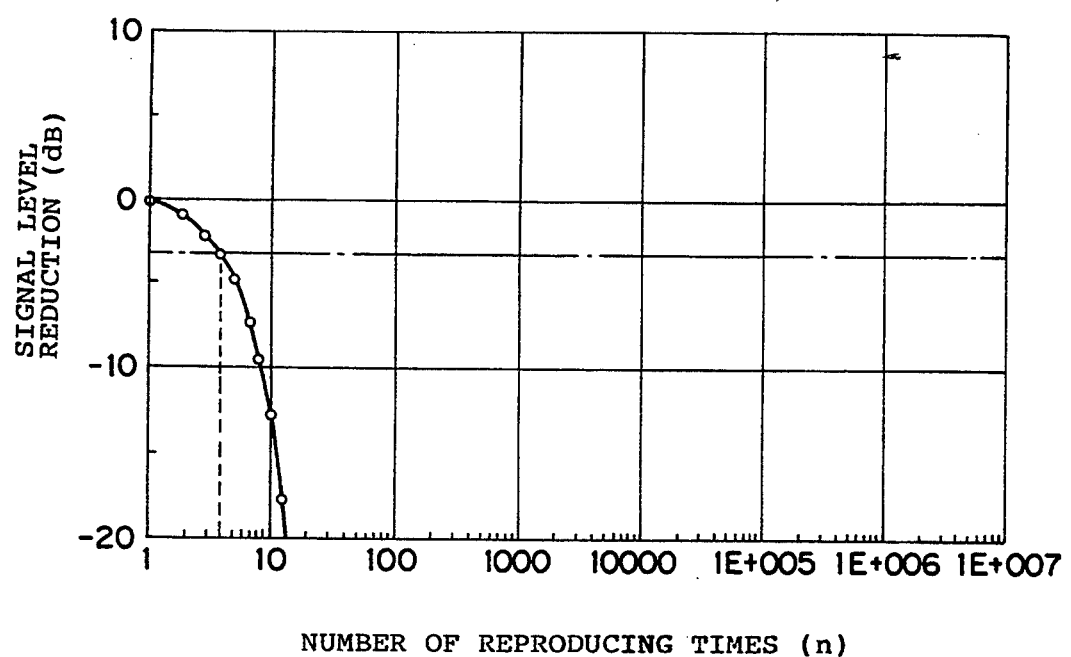
FIG. 22 illustrates a relation between a number of reproducing times and an amount of signal level reduction in comparative example 2-1.

The information was reproduced with reproducing power $P_{rep}$ of 0.5 mW, to result in an initial C-N ratio of 49 dB. FIG. 22 shows C level reduction in repeated reproduction. As clearly understood from FIG. 22, it was possible to reproduce the information only four times.

EXAMPLE 2-1

Figure 23:
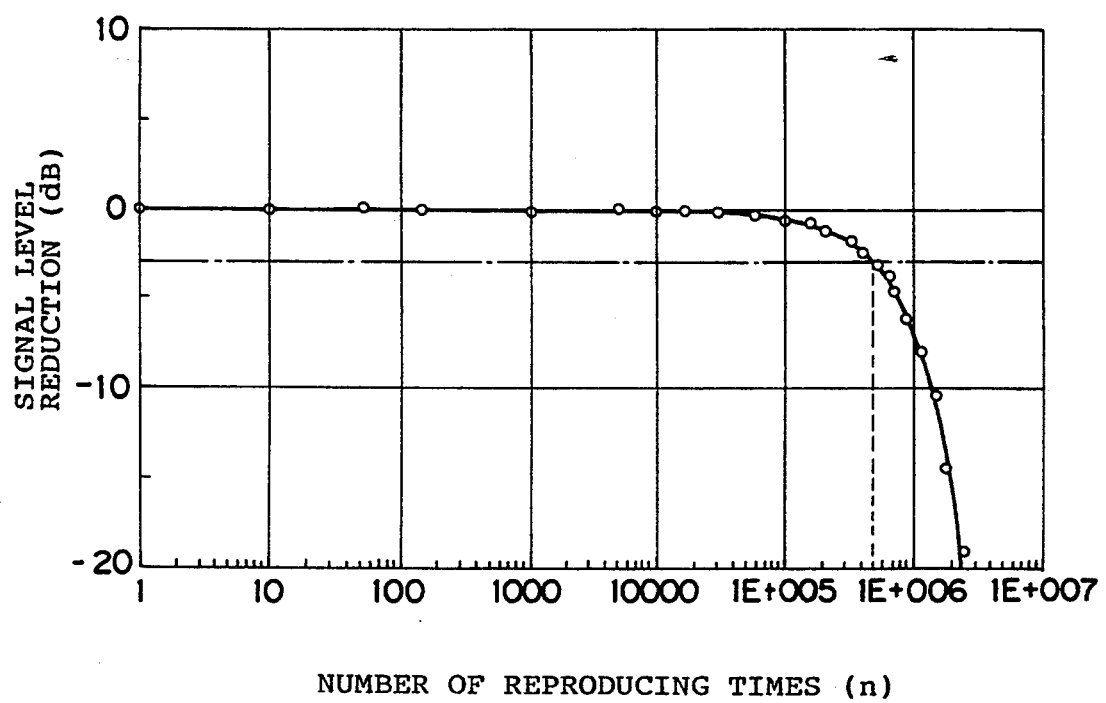
FIG. 23 illustrates a relation between a number of reproducing times and an amount of signal level reduction in Example 2-1.

The information was reproduced with reproducing power $P_{rep}$ of 2.6 nW, which was within the range according to the first aspect of the present invention. The resultant initial C-N ratio was 44 dB. This C-N ratio satisfied the aforementioned value of the required C-N ratio. FIG. 23 shows C level reduction in repetition. As clearly understood from FIG. 23, it was possible to reproduce the information 480,000 times.

EXAMPLE 2-2

Figure 24:
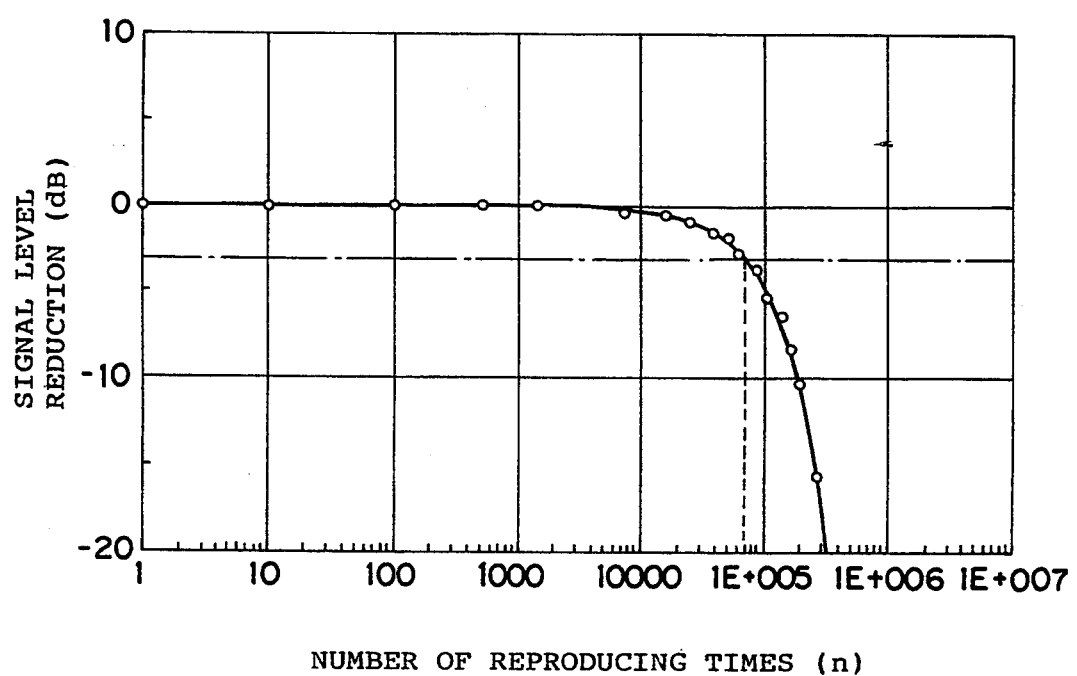
FIG. 24 illustrates a relation between a number of reproducing times and an amount of signal level reduction in Example 2-2.

The information was reproduced with reproducing power $P_{rep}$ of 20 nW, which was within the range according to the second aspect of the present invention. The resultant initial C-N ratio was 49 dB. FIG. 24 shows C level reduction in repeated reproduction. As clearly understood from FIG. 24, it was possible to reproduce the information 70,000 times.

Comparative Example 2-2

The information was reproduced with reproducing power $P_{rep}$ of 1.3 nW, which was lower than the ranges according to the first and second aspects of the present invention. The resultant initial C-N ratio was 40 dB. This value did not satisfy the value of the aforementioned required C-N ratio.

Experimental Examples according to the sixth aspect of the present invention are now described.

<EXAMPLE 3>

Information was recorded in an optical recording medium having an initial reflectance $R_L$ of 0.25 at $\lambda=633$ nm, with recording power of 5 mW. At this time, a recorded portion exhibited a reflectance $R_H$ of 0.78, with a reflectance change $\Delta R$ of 0.51 and an average reflectance $R_{ave}$ of 0.51.

EXAMPLE 3-1

Figure 25:
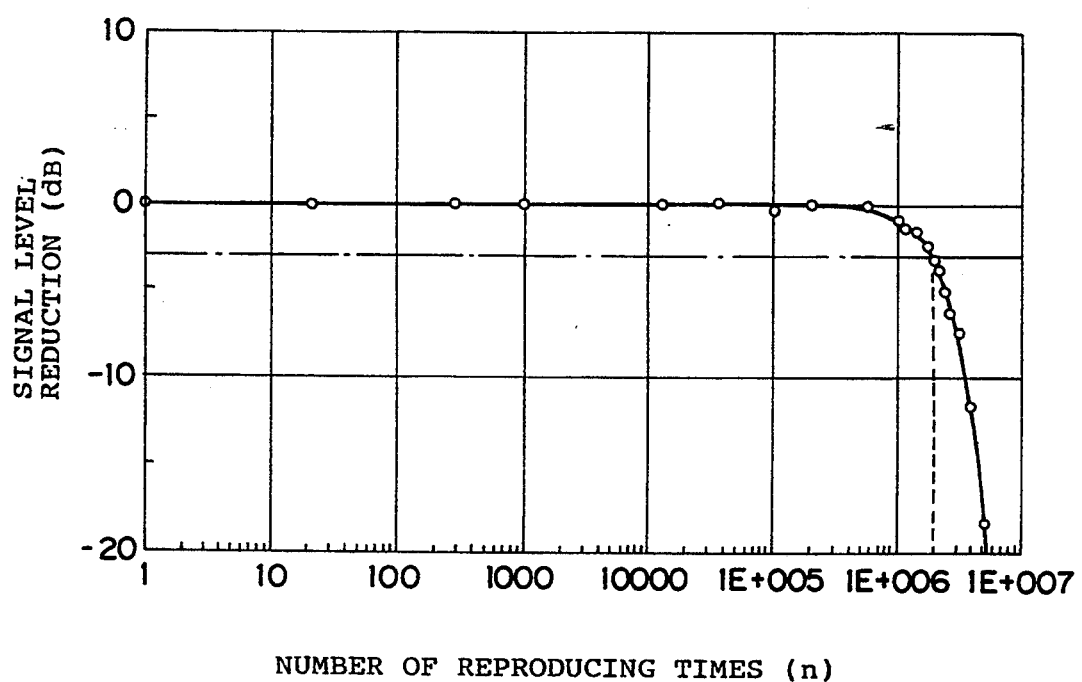
FIG. 25 illustrates a relation between a number of reproducing times and an amount of signal level reduction in Example 3-1.

The information was reproduced with reproducing power $P_{rep}$ of 1.6 nW, which was within the range according to the first aspect of the present invention. The resultant initial C-N ratio was 44 dB. FIG. 25 shows C level reduction in repeated reproduction. As clearly understood from FIG. 25, it was possible to reproduce the information 2,000,000 times. This number of reproducible times was greater than those in Examples 1-1, 2-1 and 2-2.

EXAMPLE 3-2

Figure 26:
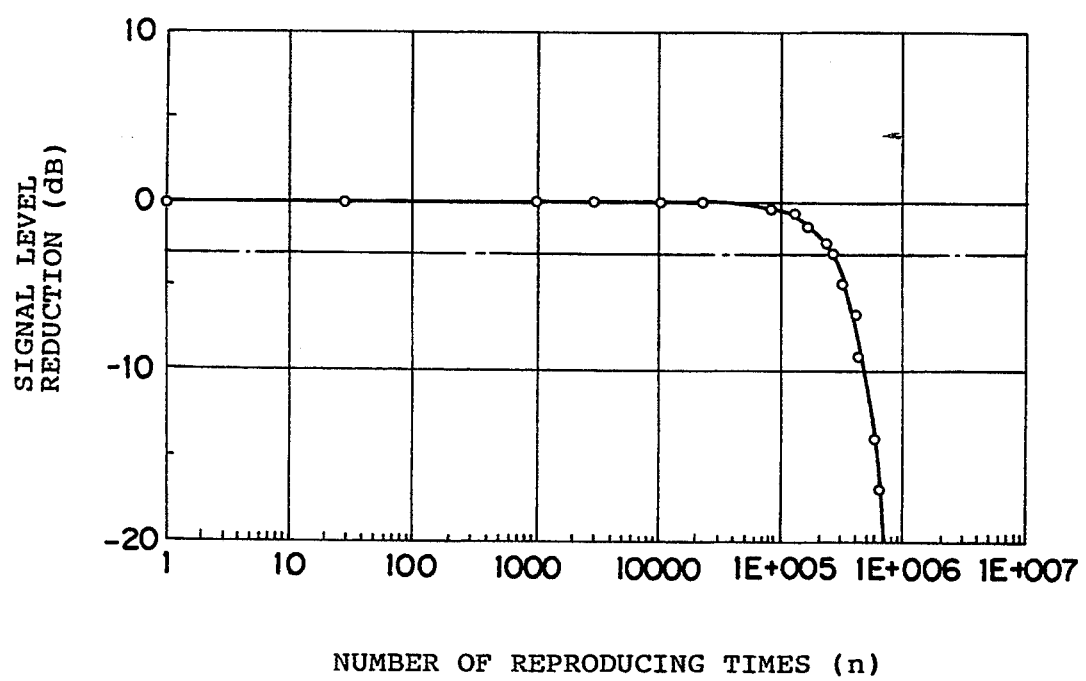
FIG. 26 illustrates a relation between a number of reproducing times and an amount of signal level reduction in Example 3-2.

The information was reproduced with reproducing power $P_{rep}$ of 12 nW, which was within the range according to the second aspect of the present invention. The resultant initial C-N ratio was 47 dB. FIG. 26 shows C level reduction in repeated reproduction. As clearly understood from FIG. 26, it was possible to reproduce the information 250,000 times.

Comparative Example 3-1

Figure 27:
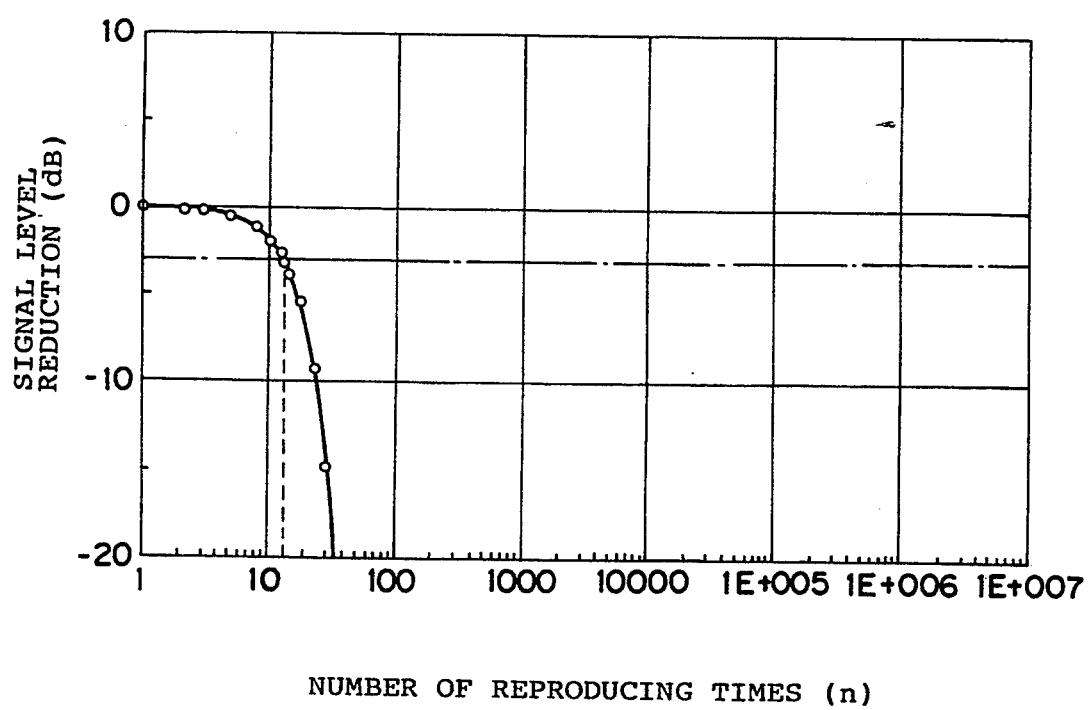
FIG. 27 illustrates a relation between a number of reproducing times and an amount of signal level reduction in comparative example 3-1.

The information was reproduced with reproducing power of 0.25 mW, which was 1/20 of the recording power. The resultant initial C-N ratio was 49 dB. However, it was possible to reproduce the information only 13 times, as shown in FIG. 27.

<EXAMPLE 4>

Information was optically recorded in the optical recording medium, employed in Example 3, having an initial reflectance $R_L$ of 0.25 at $\lambda=633$ nm, with recording power of 3 mW. At this time, a recorded portion exhibited a reflectance $R_H$ of 0.57, with a reflectance change $\Delta R$ of 0.32 and an average reflectance $R_{ave}$ of 0.41.

EXAMPLE 4-1

Figure 28:
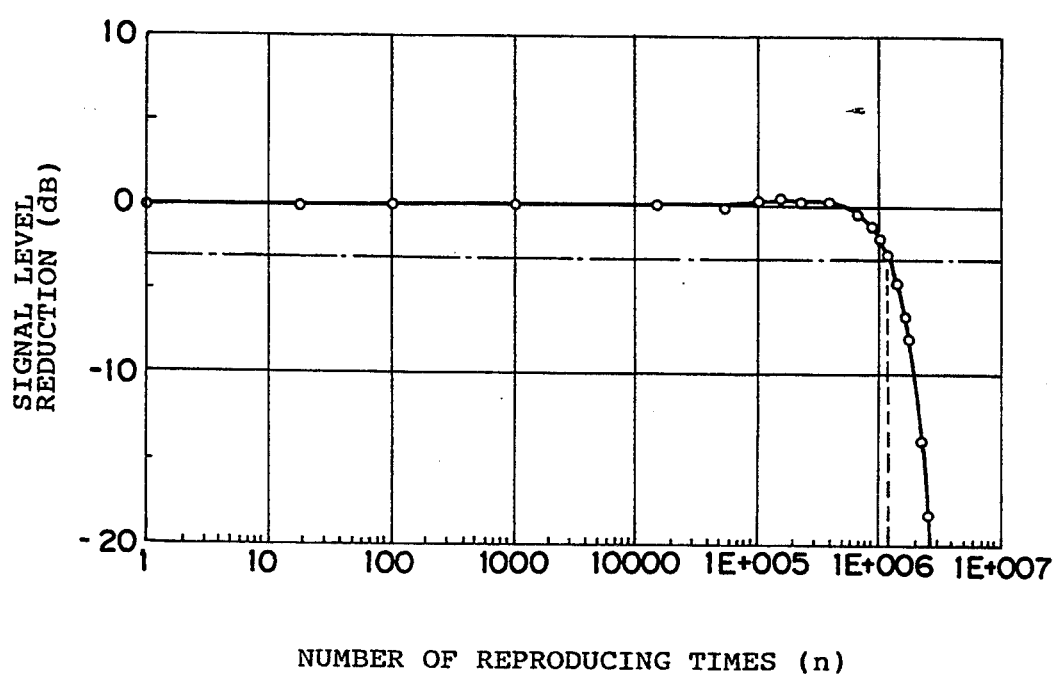
FIG. 28 illustrates a relation between a number of reproducing times and an amount of signal level reduction in Example 4-1.

The information was reproduced with reproducing power $P_{rep}$ of 3.4 nW, which was within the range according to the first aspect of the present invention. The resultant initial C-N ratio was 44 dB. FIG. 28 shows C level reduction in repetition. It was possible to reproduce the information 1,300,000 times. While this number of reproducible times was slightly reduced as compared with 2,000,000 times in Example 3-1, a reproducing photodetector may have a small bias voltage in this case since the reproducing power was increased by at least twice and the structure of the detection circuit system can be further simplified since an amplifier system may have a small gain.

<EXAMPLE 5>

Information was optically recorded in an optical recording medium having an initial reflectance $R_L$ of 0.13 at $\lambda=633$ nm with recording power of 4 mW. At this time, a recorded portion exhibited a reflectance $R_H$ of 0.47, with a reflectance change $\Delta R$ of 0.34 and an average reflectance $R_{ave}$ of 0.30.

EXAMPLE 5-1

Figure 29:
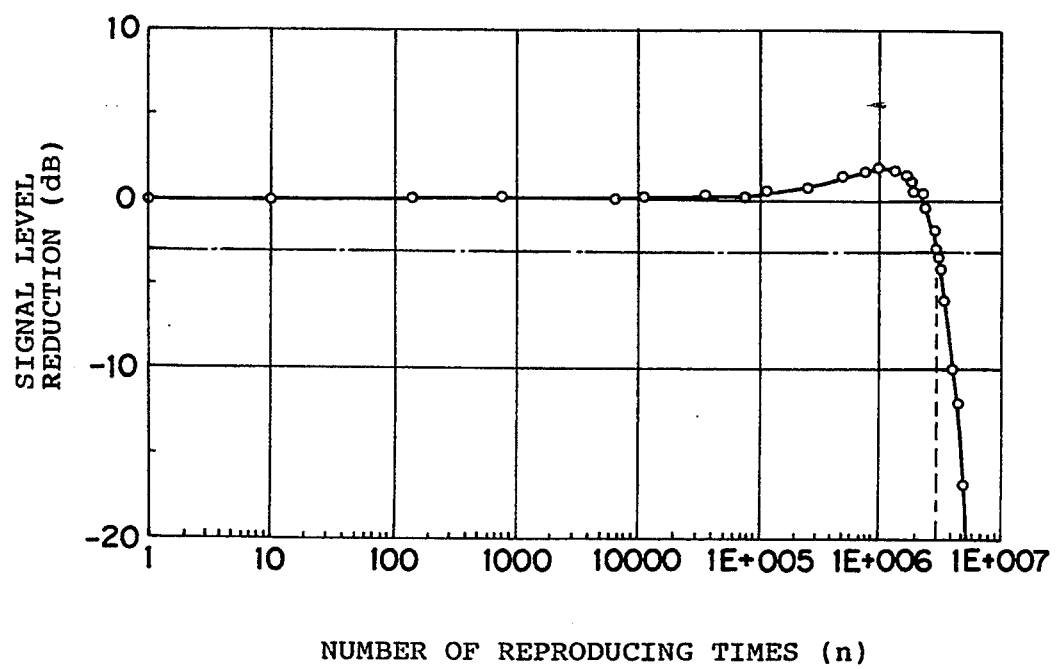
FIG. 29 illustrates a relation between a number of reproducing times and an amount of signal level reduction in Example 5-1.

The information was reproduced with reproducing power $P_{rep}$ of 2.1 nW, which was within the range according to the first aspect of the present invention. The resultant initial C-N ratio was 44 dB. FIG. 29 shows C level reduction in repeated reproduction. As clearly understood from FIG. 29, the signal level was slightly improved by about 2 dB and then reduced along repetition of reproduction, and it was possible to reproduce the information 3,000,000 times.

EXAMPLE 5-2

Figure 30:
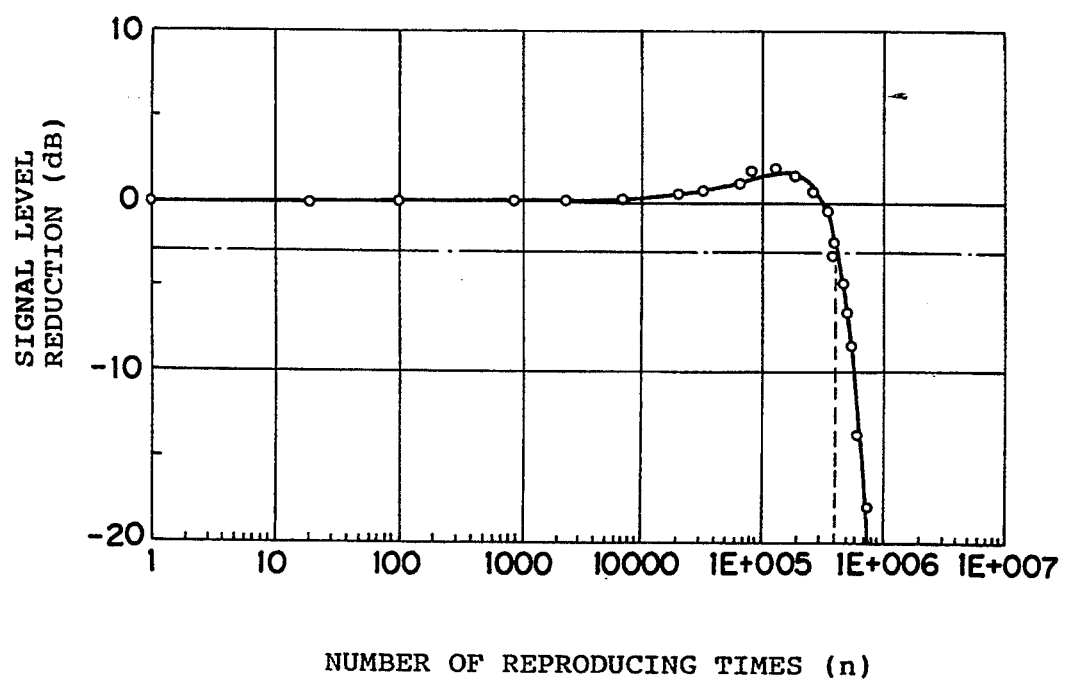
FIG. 30 illustrates a relation between a number of reproducing times and an amount of signal level reduction in Example 5-2.

The information was reproduced with reproducing power $P_{rep}$ of 15 nW, which was within the range according to the second aspect of the present invention. The resultant initial C-N ratio was 48 dB. FIG. 30 shows C level reduction in repeated reproduction. As clearly understood from FIG. 30, the signal level was temporarily improved by about 2 dB and thereafter reduced along repetition of reproduction. It was possible to reproduce the information 400,000 times.

<EXAMPLE 6>

Information was optically recorded in the optical recording medium employed in Example 5, with recording power changed from 4 mW to 2 mW. At this time, a recorded portion exhibited a reflectance $R_H$ of 0.18, with a reflectance change $\Delta R$ of 0.06 and an average reflectance $R_{ave}$ of 0.16.

EXAMPLE 6-1

Figure 31:
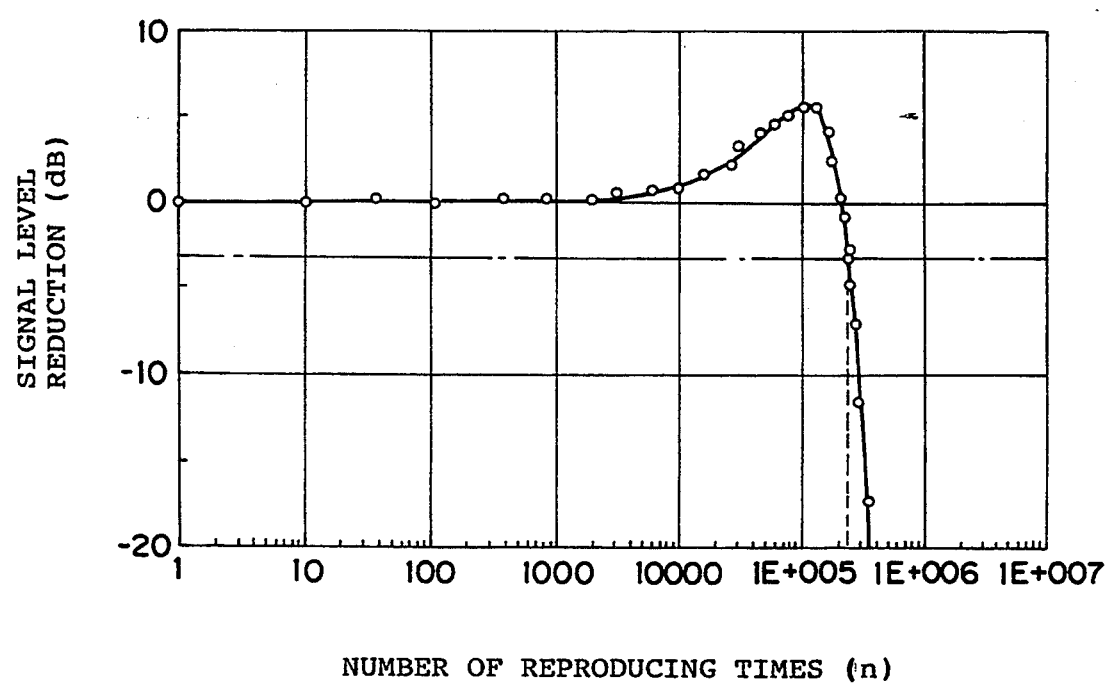
FIG. 31 illustrates a relation between a number of reproducing times and an amount of signal level reduction in Example 6-1.

The information was reproduced with reproducing power $P_{rep}$ of 37 nW, which was within the range according to the first aspect of the present invention. The resultant initial C-N ratio was 44 dB. FIG. 31 shows C level reduction in repeated reproduction. As shown in FIG. 31, it was possible to reproduce the information 230,000 times, while the signal level was remarkably improved by 5.5 dB and thereafter reduced with repetition of reproduction. In consideration of the fact that the reproduced signal level is preferably as stable as possible, Examples 5-1 and 5-2 are more preferable.

In addition to the aforementioned Examples, recording power was experimentally controlled for changing the reflectance $R_H$ of the recorded portion to various levels, to find that such remarkable increase of the C level is not caused when $R_H$ is at least 0.4. It was further proved that such remarkable increase of the C level is recognized in an optical recording medium having an initial reflectance $R_L$ of less than 0.2.

When information is reproduced from an optical recording medium having an initial reflectance $R_L$ exceeding 0.4 with very low power according to the first or second aspect of the present invention, the information can be reproduced at the order of 100,000 times, as hereinabove described. When information is reproduced from an optical recording medium having an initial reflectance $R_L$ of not more than 0.4 with very low power according to the first or second aspect of the present invention, on the other hand, it is possible to reproduce the information at the order of 1,000,000 times.

Particularly when information is recorded in an optical recording medium having a reflectance $R_L$ of not more than 0.4 with recording power being so controlled that a recorded portion has a reflectance $R_H$ of not more than 0.7, it is possible to reduce burdens on a reproducing photodetector, an amplifier circuit and the like.

As to an optical recording medium having a reflectance $R_L$ of not more than 0.2, it is possible to suppress remarkable increase of a signal level following reproduction thereby obtaining a stable signal level by recording information with conditions being so set that a recorded portion has a reflectance $R_H$ of at least 0.4.

While the reflective layer of the optical recording medium is prepared from Ag having a high reflectance in each of the aforementioned embodiments, the present invention is also applicable to a reflective layer of aluminum or chromium, which has a reflectance of not more than 1. When the reflective layer has a reflectance of not more than 1, a reflectance R of the optical recording medium with respect to absorbance Abs of a recording layer and a reflectance $R_0$ of the reflective layer can be expressed as follows:

$$R = e^{-2.3 \times Abs} R_0 e^{-2.3 \times Abs}$$

where the absorbance Abs is indicated as a value with respect to single passage of light through the recording layer.

When the reflective layer has a reflectance $R_0$ of not more than 1, the present invention can be applied along the aforementioned expression.

When the reflectance $R_0$ of the reflective layer is regarded as 1, the reflectance R is expressed as follows:

$$R = e^{-2 \times 2.3 \times Abs}$$

Description is now made on an embodiment employing squeezed light having suppressed photon number fluctuation as a reproducing beam according to the seventh aspect of the present invention.

Figure 32:
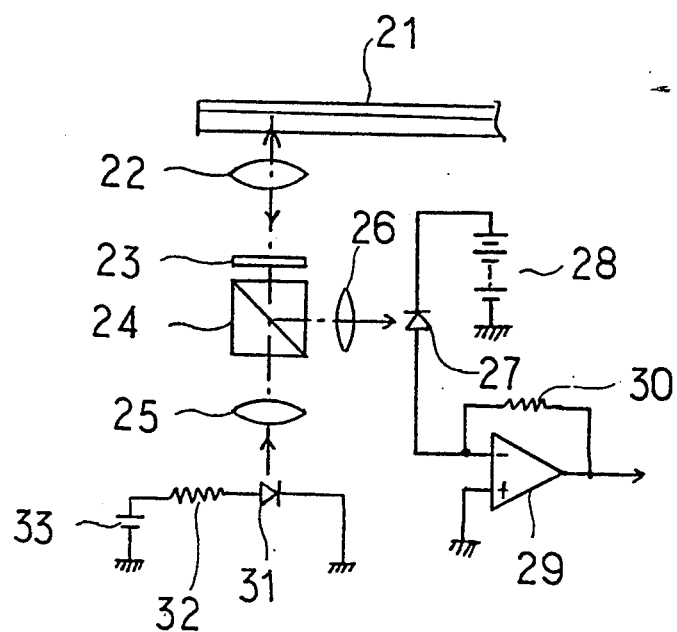
FIG. 32 is a block diagram showing an embodiment of a reproducing apparatus for carrying out a reproducing method according to the seventh aspect of the present invention.

FIG. 32 is a block diagram showing a reproducing apparatus for carrying out the reproducing method according to the seventh aspect of the present invention. Referring to FIG. 32, numeral 31 denotes a semiconductor laser and numeral 32 denotes a resistance, while numeral 33 denotes a driving power source. The resistance 32 is set to have a value of at least twice the differential resistance value of the semiconductor laser 31, so that an excitation current is injected into the semiconductor laser 31. Due to such setting, a reproducing beam emitted from the semiconductor laser 31 enters a squeezed state having suppressed photon number fluctuation.

According to this embodiment, further, spontaneous emission of the semiconductor laser 31 is suppressed by a fine resonator structure.

The technical content of such a semiconductor laser having a fine resonator structure is disclosed in the 38th Joint Lecture Meeting (Spring 1991), the Japan Society of Applied Physics, 30P-F-7 to 9, the 39th Joint Lecture Meeting (Spring 1992), the Japan Society of Applied Physics, 29P-C-14, the 53rd Scientific Lecture Meeting (Autumn 1992), the Japan Society of Applied Physics, 16a-V-3, "Fine Resonator Laser: Status Quo and Prospect" by Hiroyuki Yokoyama, Applied Physics, Vol. 61, No. 9 (1992), pp. 890 to 901, and the like. In particular, the fine resonator structure is characterized in that laser oscillation can be set at a very low threshold value.

An ordinary semiconductor laser has an oscillation threshold value of about several 10 mA, and hence it is impossible to stably control its laser beam by an injection current with very low power of the order of not more than several $\mu W$. In a semiconductor laser whose spontaneous emission is suppressed by the fine resonator structure, on the other hand, it is possible to stably control laser power below the $\mu W$ order with an injection current of the $\mu A$ order by controlling a reflectance R on an end surface of the resonator.

Referring to FIG. 32, a reproducing beam which is emitted from the semiconductor laser 31 serving as a light source is shaped by a collimator lens 25 and passes through a polarized beam splitter 24 and a quarter-wave plate 23, to be converged on a photon mode medium 21, such as a photochromic medium, by an objective lens 22. The reflected beam is intensity-modulated in response to recorded information, and again passes through the objective lens 22, the quarter-wave plate 23 and the polarized beam splitter 24, to enter a photodetector 27 through a lens 26. While such a photodetector is generally prepared from a PIN photodiode, this photodetector 27 is preferably prepared from that having a self amplifying function for a photocurrent since a reproduction S-N ratio is reduced by a thermal noise in a PIN photodiode when very low reproducing power is employed as in the present invention. According to the present invention, the photodiode 27 is prepared from an avalanche photodiode, to which a high reverse bias current (several 10 to 100 V) 28 is applied. The detected photocurrent is converted to a voltage by a current-to-voltage converting part which is formed by a combination of a differential amplifier 29 and a resistance 30, to provide a reproduced output.

In order to prevent breakage of the squeezed state caused by optical loss, loss of the optical system is preferably reduced to the minimum while quantum efficiency in photoelectric conversion of the photodetector 27 is preferably increased to the maximum. Further, the optical recording medium 21 preferably has a high average reflectance. In order to reduce the loss of the optical system, further, the respective optical elements are preferably provided with nonreflective coatings.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reproducing method for an optical recording medium for reproducing information from an optical recording medium having a recording layer reacting in a photon mode, said method comprising the steps of:
    irradiating said recording layer with a reproducing beam of power being set in proximity to $P_{rep}$ (W) appearing in the following expression (I):

$$P_{rep} = \frac{SNR \cdot 2eB}{\eta\gamma} \cdot \frac{R_{ave}}{(\Delta R)^2} \quad (I)$$

where SNR represents an S-N power ratio (PP/rms) required for a system, e represents an elementary electric charge of $1.6 \times 10^{-19}$ (C), B represents a bandwidth (Hz) of said system, $\eta$ represents sensitivity (A/W) of a photodetector with respect to a gain 1, $\gamma$ represents pickup efficiency, $R_{ave}$ represents an average reflectance of said optical recording medium, and $\Delta R$ represents a difference in reflectance between recorded and unrecorded portions of said optical recording medium; and
    detecting said reproducing beam passing through said recording layer for reproducing recorded and unrecorded states.

2. A reproducing method for an optical recording medium in accordance with claim 1, wherein said reproducing beam passing through said recording layer is detected by a detector having a self amplifying function for a photocurrent.

3. A reproducing apparatus for an optical recording medium for reproducing information from an optical recording medium having a recording layer reacting in a photon mode, said apparatus comprising:
    a light source for emitting a reproducing beam with constant power;
    power control means for damping said reproducing beam from said light source to the level of said power described in claim 1 for irradiating said recording layer with said reproducing beam;
    a lens system for converging said reproducing beam on said recording layer; and
    a detector for detecting said reproducing beam passing through said recording layer and being reflected by said optical recording medium.

4. A reproducing apparatus for an optical recording medium in accordance with claim 3, wherein said detector is a detector having a self amplifying function for a photocurrent.

5. A reproducing method for an optical recording medium in accordance with claim 1, for optically recording information and reproducing said information using an optical recording medium having a reflectance of not more than 0.4 for said reproducing beam in an unrecorded state of said recording layer.

6. A reproducing method for an optical recording medium in accordance with claim 5, wherein said recorded portion of said recording layer has a reflectance of not more than 0.7 for said reproducing beam.

7. A reproducing method for an optical recording medium in accordance with claim 5, wherein a reflectance for said reproducing beam in an unrecorded state of said recording layer is not more than 0.2, and a reflectance of said recorded portion for said reproducing beam is at least 0.4.

8. A reproducing method for an optical recording medium in accordance with claim 1, wherein said reproducing beam is prepared from squeezed light having suppressed photon number fluctuation.

9. A reproducing method for an optical recording medium for reproducing information from an optical recording medium having a recording layer reacting in a photon mode, said method comprising the steps of:
    irradiating said recording layer with a recording beam of power being set within a range of $P_{rep}$ (W) appearing in the following expression (II):

$$\frac{SNR \cdot 2eB}{\eta\gamma} \cdot \frac{R_{ave}}{(\Delta R)^2} \leq P_{rep} \leq \frac{kT}{2eBR_{ave}\eta\gamma Z} \left( \text{or } \frac{I_{amp}^2}{2eBR_{ave}\eta\gamma} \right) \quad (II)$$

here SNR represents an S-N power ratio (PP/rms) required for a system, e represents an elementary electric charge of $1.6 \times 10^{-19}$ (C), B represents a bandwidth (Hz) of said system, $\eta$ represents sensitivity (A/W) of a photodetector with respect to a gain 1, $\gamma$ represents pickup efficiency, $R_{ave}$ represents an average reflectance of said optical recording medium, $\Delta R$ represents a difference in reflectance between recorded and unrecorded portions of said optical recording medium, k represents the Boltzman constant $1.38 \times 10^{-23}$ (J·K$^{-1}$), T represents an absolute temperature (K), $I_{amp}$ represents an average noise current (A) of a reproducing preamplifier, and Z represents impedance ($\Omega$) of said reproducing preamplifier; and
    detecting said reproducing beam passing through said recording layer for reproducing recorded and unrecorded states.

10. A reproducing method for an optical recording medium in accordance with claim 9, wherein said reproducing beam passing through said recording layer is detected by a detector having a self amplifying function for a photocurrent.

11. A reproducing apparatus for an optical recording medium for reproducing information from an optical recording medium having a recording layer reacting in a photon mode, said apparatus comprising:
- a light source for emitting a reproducing beam with constant power;
- power control means for damping said reproducing beam from said light source to the level of said power described in claim 9 for irradiating said recording layer with said reproducing beam;
- a lens system for converging said reproducing beam on said recording layer; and
- a detector for detecting said reproducing beam passing through said recording layer and being reflected by said optical recording medium.

12. A reproducing apparatus for an optical recording medium in accordance with claim 11, wherein said detector is a detector having a self amplifying function for a photocurrent.

13. A reproducing method for an optical recording medium in accordance with claim 9, for optically recording information and reproducing said information using an optical recording medium having a reflectance of not more than 0.4 for said reproducing beam in an unrecorded state of said recording layer.

14. A reproducing method for an optical recording medium in accordance with claim 13, wherein said recorded portion of said recording layer has a reflectance of not more than 0.7 for said reproducing beam.

15. A reproducing method for an optical recording medium in accordance with claim 13, wherein a reflectance for said reproducing beam in an unrecorded state of said recording layer is not more than 0.2, and a reflectance of said recorded portion for said reproducing beam is at least 0.4.

16. A reproducing method for an optical recording medium in accordance with claim 9, wherein said reproducing beam is prepared from squeezed light having suppressed photon number fluctuation.

17. A reproducing method for an optical recording medium for reproducing information from an optical recording medium having a recording layer reacting in a photon mode, said method comprising the steps of:
- irradiating said recording layer with a reproducing beam of power being set within a range of $P_{rep}$ (W) appearing in the following expression (II):

$$\frac{SNR \cdot 2eB}{\eta\gamma} \cdot \frac{R_{ave}}{(\Delta R)^2} \leq P_{rep} \leq \frac{kT}{2eBR_{ave}\eta\gamma Z} \left( \text{or } \frac{I_{amp}^2}{2eBR_{ave}\eta\gamma} \right) \quad (II)$$

where SNR represents an S-N power ratio (PP/rms) required for a system, e represents an elementary electric charge of $1.6 \times 10^{-19}$ (C), B represents a bandwidth (Hz) of said system, $\eta$ represents sensitivity (A/W) of a photodetector with respect to a gain 1, $\gamma$ represents pickup efficiency, $R_{ave}$ represents an average reflectance of said optical recording medium, $\Delta R$ represents a difference in reflectance between recorded and unrecorded portions of said optical recording medium, k represents the Boltzman constant $1.38 \times 10^{-23}$ (J·K$^{-1}$), T represents an absolute temperature (K), $I_{amp}$ represents an average noise current (A) of a reproducing preamplifier, and Z represents impedance ($\Omega$) of said reproducing preamplifier;
- detecting said reproducing beam passing through said recording layer for reproducing recorded and unrecorded states; and
- irradiating said recording layer with light in a wavelength band allowing substantially no absorption by a photon mode material contained in said recording layer as a servo beam, thereby carrying out at least either focus servo control or tracking servo control.

18. A reproducing apparatus for an optical recording medium for reproducing information from an optical recording medium having a recording layer reacting in a photon mode, said apparatus comprising:
- a first light source for emitting a reproducing beam with constant power;
- power control means for damping said reproducing beam from said first light source to the level of said power described in claim 17 for irradiating said recording layer with said reproducing beam;
- a second light source for emitting light of a wavelength band allowing substantially no absorption by a photon mode material contained in said recording layer as a servo beam;
- beam synthesis means for synthesizing said reproducing beam with said servo beam and guiding the synthesized beam to the same optical path;
- a lens system for converging said synthesized beam on said recording layer;
- a photodetector, having a self amplifying function for a photocurrent, for detecting a component of said reproducing beam contained in said synthesized beam passing through said recording layer and being reflected by said optical recording medium; and
- a servo optical system and a servo circuit system for detecting a component of said servo beam contained in said synthesized beam passing through said recording layer and being reflected by said optical recording medium for carrying out at least either focus servo control or tracking servo control.

19. A reproducing apparatus for an optical recording medium in accordance with claim 18, wherein wavelength selection means substantially transmitting said reproducing beam and substantially not transmitting said servo beam is provided in an optical path of said component of said reproducing beam contained in said synthesized beam being reflected from said optical recording medium for entering said photodetector.

20. A reproducing apparatus for an optical recording medium in accordance with claim 18, wherein said beam synthesis means is formed by a dichroic mirror so that said servo beam contained in said synthesized beam being reflected from said optical recording medium is reflected by said dichroic mirror.

21. A reproducing apparatus for an optical recording medium in accordance with claim 18, wherein wavelength selection means substantially transmitting said servo beam and substantially not transmitting other said light emitted from said second light source is provided between said second light source and said beam synthesis means.

22. A reproducing method for an optical recording medium for reproducing information from an optical recording medium having a recording layer reacting in a photon mode, said method comprising the steps of:
- irradiating said recording layer with squeezed light having suppressed photon number fluctuation with power being set within a range of $P_{rep}$ (W) appearing in the following expression (III) as a reproducing beam for reproducing said information:

$$P_{rep} \leq \frac{SNR \cdot 2eB}{\eta\gamma} \cdot \frac{R_{avr}}{(\Delta R)^2} \qquad \text{(III)}$$

where SNR represents an S-N power ratio (PP/rms) required for a system, e represents an elementary electric charge of $1.8 \times 10^{-19}$ (C), B represents a bandwidth (Hz) of said system, $\eta$ represents sensitivity (A/W) of a photodetector with respect to a gain 1, $\gamma$ represents pickup efficiency, $R_{ave}$ represents an average reflectance of said optical recording medium, and $\Delta R$ represents a difference in reflectance between recorded and unrecorded portions of said optical recording medium.

* * * * *